(12) United States Patent  
Matsubara et al.

(10) Patent No.: US 11,550,372 B2  
(45) Date of Patent: Jan. 10, 2023

(54) INFORMATION PROCESSING APPARATUS HAVING DUST-PROOF BEZEL AND INFORMATION PROCESSING METHOD USING THE SAME

(71) Applicant: FUJITSU LIMITED, Kawasaki (JP)

(72) Inventors: Masakazu Matsubara, Setagaya (JP); Kohei Kida, Kawasaki (JP); Hiromichi Okabe, Kawasaki (JP); Minoru Hirano, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 830 days.

(21) Appl. No.: 16/459,652

(22) Filed: Jul. 2, 2019

(65) Prior Publication Data

US 2020/0012325 A1 Jan. 9, 2020

(30) Foreign Application Priority Data

Jul. 6, 2018 (JP) .............................. JP2018-129242  
Apr. 10, 2019 (JP) .............................. JP2019-075035

(51) Int. Cl.
```
G06F 1/20      (2006.01)
G01K 7/42      (2006.01)
H05K 7/20      (2006.01)
```

(52) U.S. Cl.  
CPC .............. G06F 1/20 (2013.01); G01K 7/425 (2013.01); *G06F 2200/201* (2013.01); *H05K 7/20836* (2013.01)

(58) Field of Classification Search  
None  
See application file for complete search history.

(56) References Cited

U.S. PATENT DOCUMENTS 5,513,344 A * 4/1996 Nakamura ............. G11C 29/08  
714/42  
5,673,029 A * 9/1997 Behl .................... G11B 33/142  
(Continued)

FOREIGN PATENT DOCUMENTS

| JP | 2007-311458 | 11/2007 |
| JP | 2012-66190 | 4/2012 |
| JP | 2013-201304 | 10/2013 |

OTHER PUBLICATIONS

Japanese Office Action dated Oct. 25, 2022 for corresponding Japanese Patent Application No. 2019-075035, with English Translation, 8 pages. *Please note JP-2013-201304-A cited herewith, was previously cited in an IDS filed on Jul. 2, 2019.*.

*Primary Examiner* — Adam Lee  
(74) *Attorney, Agent, or Firm* — Fujitsu Patent Center

(57) ABSTRACT

An information processing apparatus includes a fan that cools a first processor, a dust-proof bezel that prevents dust from entering a casing, a memory, and a second processor coupled to the memory. The second processor is configured to measure a temperature of the first processor and an air volume of an air flow which passes through the dust-proof bezel, compare a registered air volume to the measured air volume when the temperature matches a registered temperature included in comparison information stored in the memory. The registered air volume being included in the comparison information in association with the matched temperature and the comparison information including a registered temperature of the first processor and a registered air volume of an air flow generated by the fan in association with each other. The second processor determines an abnormality in the dust-proof bezel based on a comparison result.

20 Claims, 30 Drawing Sheets

(56) References Cited

U.S. PATENT DOCUMENTS

| Patent/Pub. No. | Date | Inventor | Classification |
|---|---|---|---|
| 6,337,630 B1* | 1/2002 | Hass | G06F 1/20 702/132 |
| 7,643,290 B1* | 1/2010 | Narasimhan | H05K 7/20727 361/695 |
| 8,395,898 B1* | 3/2013 | Chamseddine | G06F 1/203 361/695 |
| 9,128,672 B1* | 9/2015 | Loo | G06F 1/206 |
| 2003/0159802 A1* | 8/2003 | Steneby | F24F 12/006 165/59 |
| 2004/0075981 A1* | 4/2004 | Kim | G06F 1/20 361/679.47 |
| 2005/0244263 A1* | 11/2005 | Hardt | F04D 27/004 415/47 |
| 2005/0273349 A1* | 12/2005 | Abedi | G06Q 10/10 705/302 |
| 2006/0070527 A1* | 4/2006 | Chapman | B01D 46/46 96/417 |
| 2006/0172188 A1* | 8/2006 | Okuda | H01M 10/625 429/62 |
| 2006/0253633 A1* | 11/2006 | Brundridge | G06F 13/409 710/104 |
| 2009/0287456 A1* | 11/2009 | Tran | H04L 67/12 709/202 |
| 2010/0287880 A1* | 11/2010 | Yasunaga | B65B 5/103 53/64 |
| 2010/0296945 A1* | 11/2010 | Nitta | H05K 7/20836 417/2 |
| 2011/0163545 A1* | 7/2011 | Hirai | F03D 80/55 290/44 |
| 2011/0245981 A1* | 10/2011 | Refai-Ahmed | G06F 1/3203 700/282 |
| 2012/0224976 A1* | 9/2012 | Nagamatsu | G06F 1/206 417/1 |
| 2013/0085001 A1* | 4/2013 | Anderson | G07F 17/3202 463/47 |
| 2013/0128455 A1* | 5/2013 | Koblenz | H05K 7/20836 165/294 |
| 2013/0139402 A1* | 6/2013 | Hong | D06F 58/50 34/427 |
| 2014/0016268 A1* | 1/2014 | Tsujimura | G06F 1/20 361/695 |
| 2014/0064321 A1* | 3/2014 | Yokoyama | H05K 7/20836 374/4 |
| 2014/0273792 A1* | 9/2014 | Kondo | H05K 7/20836 454/184 |
| 2015/0327406 A1* | 11/2015 | Gallefoss | H05K 7/20745 361/679.46 |
| 2015/0351288 A1* | 12/2015 | Fukuda | B01D 46/681 361/679.48 |
| 2016/0085789 A1* | 3/2016 | Fuchs | G06F 16/215 707/691 |
| 2016/0094898 A1* | 3/2016 | Primm | H04Q 9/00 340/870.09 |
| 2016/0253851 A1* | 9/2016 | Pandey | G07C 5/0808 701/31.4 |

* cited by examiner

FIG. 4A
CALIBRATION VALUE DB      101

| CALIBRATION NUMBER | 0 | 0 | 0 | · · · |
|---|---|---|---|---|
| CPU TEMPERATURE(Deg-C) | 0 | 0 | 0 | · · · |
| AIR VOLUME(CFM) | 0 | 0 | 0 | · · · |
| APPROXIMATION PROCESSING FLAG | 0 | 0 | 0 | · · · |

FIG. 4B
MEASUREMENT VALUE DB      102

| MEASUREMENT NUMBER | 0 | 0 | 0 | · · · |
|---|---|---|---|---|
| CPU TEMPERATURE(Deg-C) | 0 | 0 | 0 | · · · |
| AIR VOLUME(CFM) | 0 | 0 | 0 | · · · |
| DETERMINATION RESULT | 0 | 0 | 0 | · · · |

FIG. 4C
CALIBRATION PARAMETER DB      103

| ADDITIONAL PARAMETER NUMBER | 0 | 0 | 0 | · · · |
|---|---|---|---|---|
| CPU TEMPERATURE(Deg-C) | 0 | 0 | 0 | · · · |

FIG. 4D
USER SETTING PARAMETER DB      104

| TEMPERATURE INTERVAL VALUE | 0 |
|---|---|
| WEIGHTING OF ACTUAL MEASUREMENT VALUE | 0 |
| WEIGHTING OF APPROXIMATE VALUE | 0 |
| INTERVAL TIME | 0 |

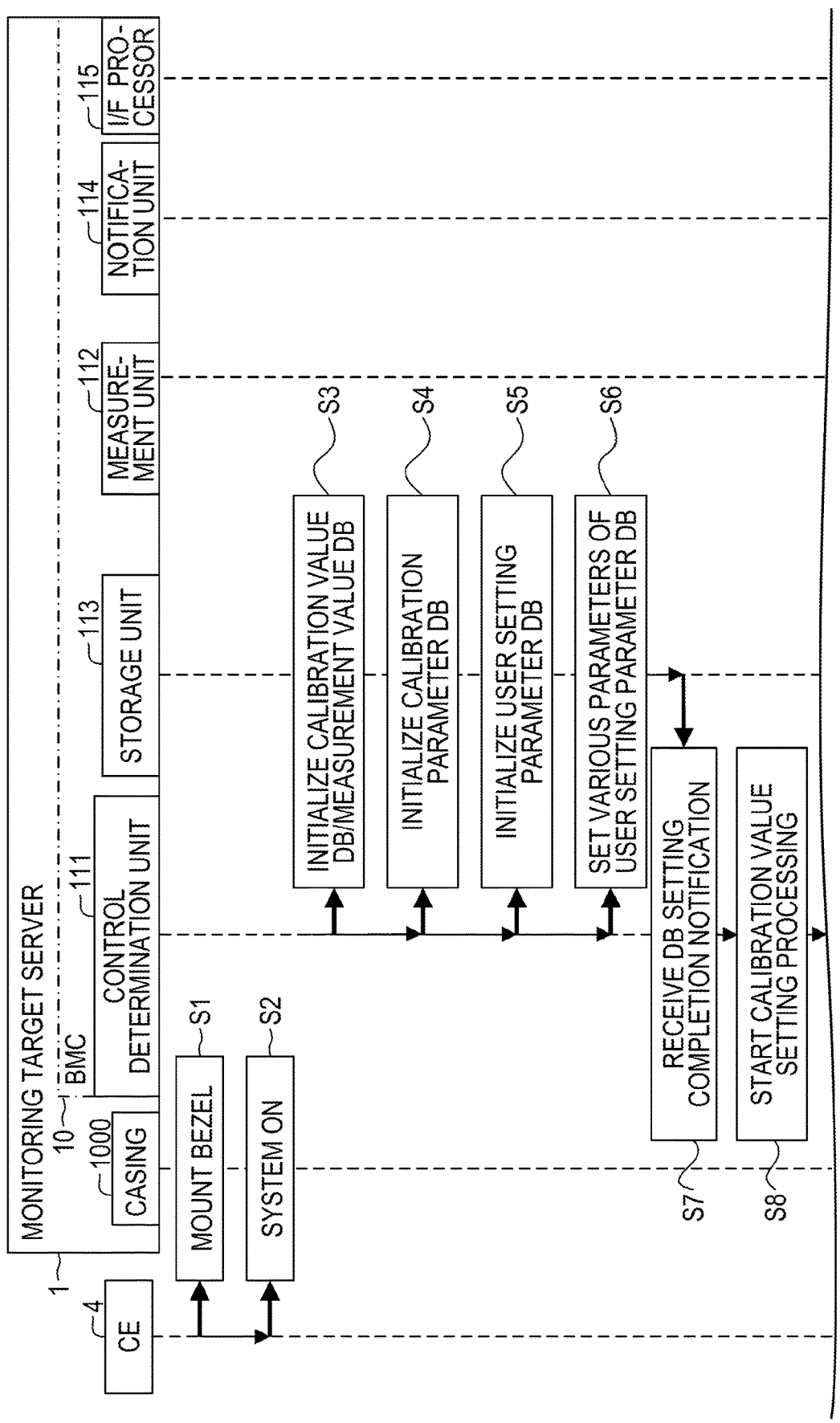

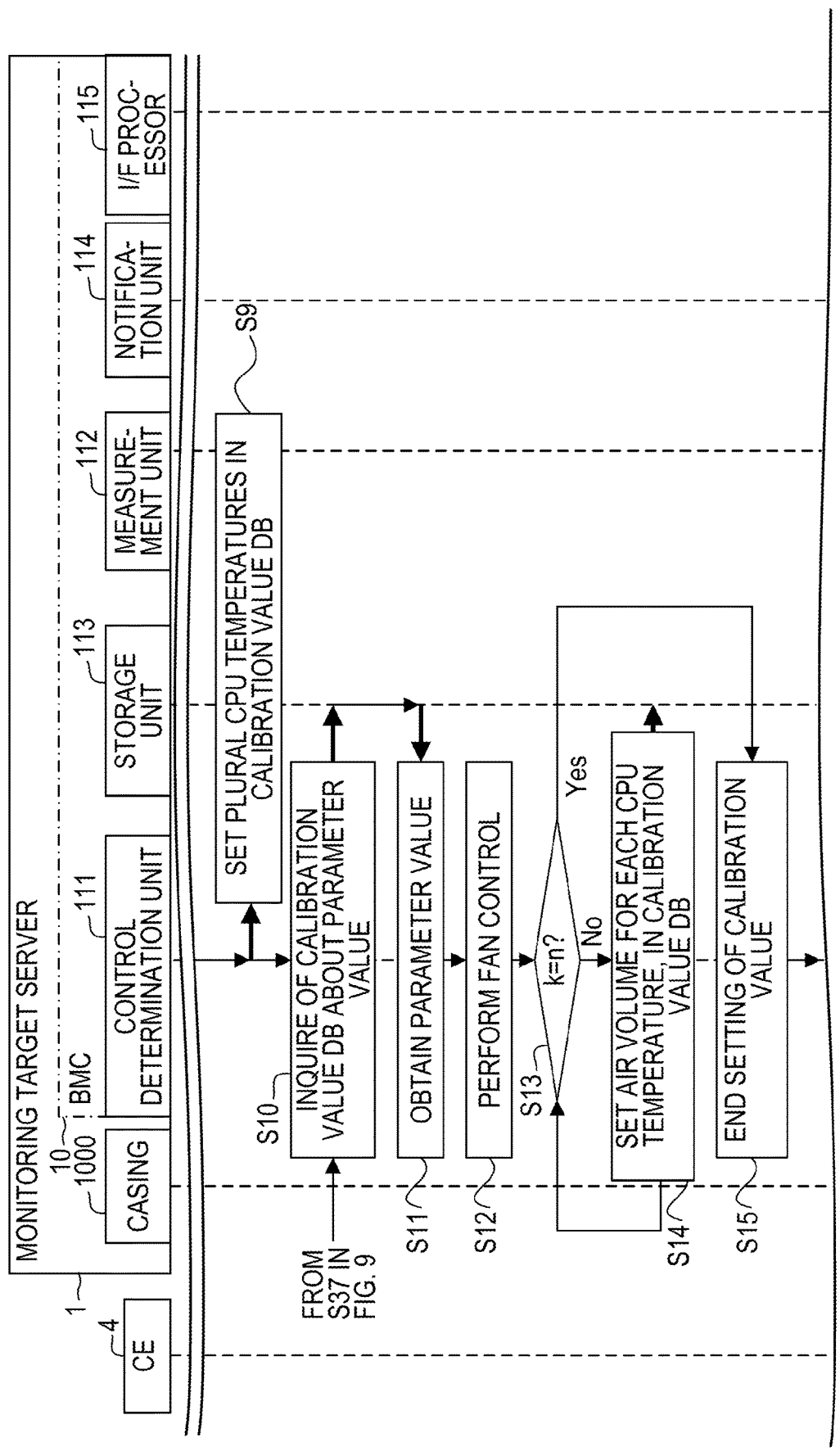

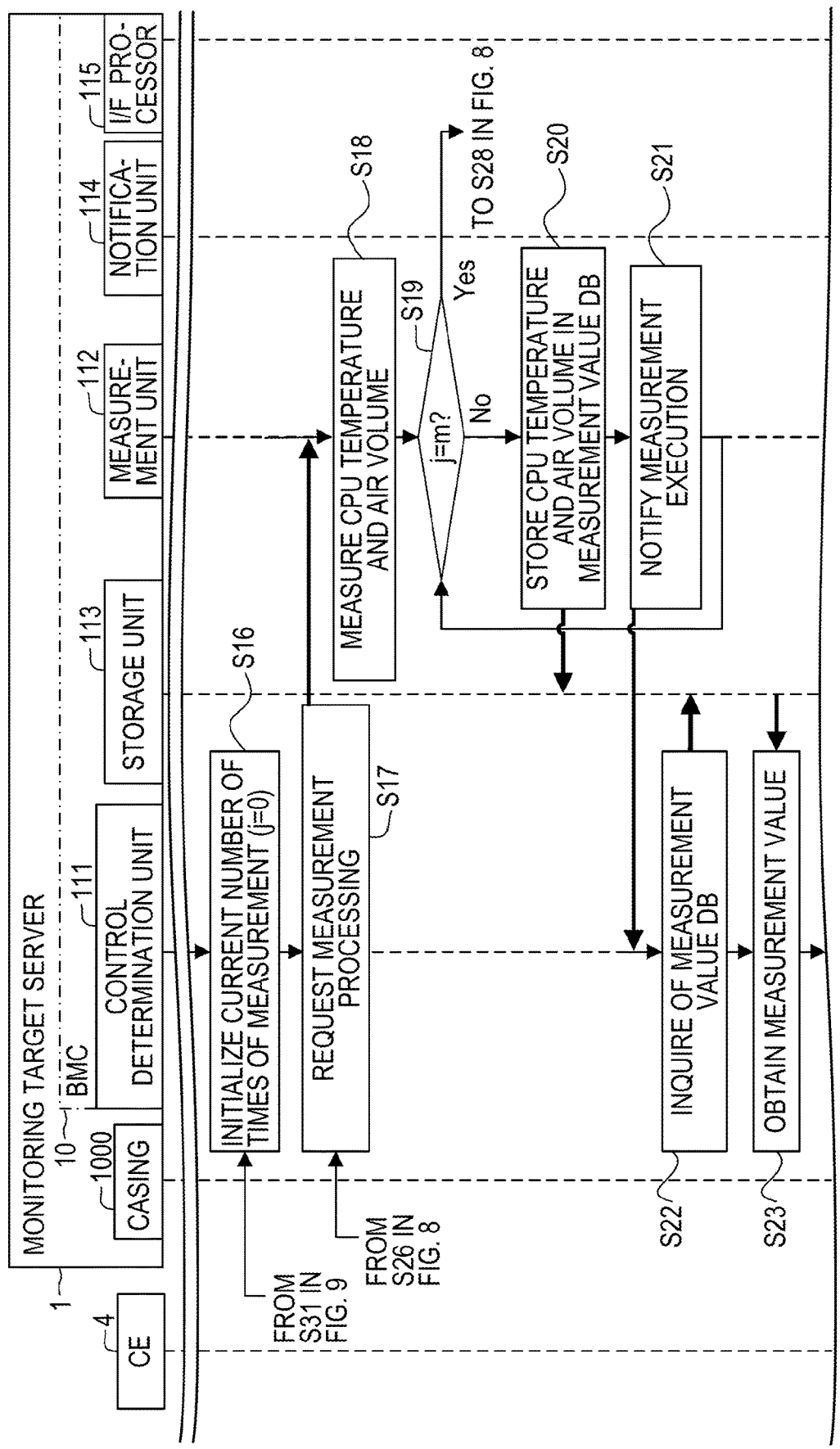

FIG. 10

| USER SETTING PARAMETER DB | 104 |
|---|---|
| TEMPERATURE INTERVAL VALUE | 0.5 |
| WEIGHTING OF ACTUAL MEASUREMENT VALUE | 5 |
| WEIGHTING OF APPROXIMATE VALUE | 1 |
| INTERVAL TIME (SEC) | 7200 |

FIG. 11A

CALIBRATION VALUE DB

| CALIBRATION NUMBER | #1 | #2 | ... | #41 | #42 | ... | #60 | #61 | ... | #99 | #100 |
|---|---|---|---|---|---|---|---|---|---|---|---|
| CPU TEMPERATURE(Deg-C) | 40.0 | 40.5 | ... | 60.0 | 60.5 | ... | 69.5 | 70.0 | ... | 89.5 | 90.0 |
| AIR VOLUME(CFM) | 0 | 0 | ... | 0 | 0 | ... | 0 | 0 | ... | 0 | 0 |
| APPROXIMATION PROCESSING FLAG | 0 | 0 | ... | 0 | 0 | ... | 0 | 0 | ... | 0 | 0 |

FIG. 11B

CALIBRATION VALUE DB

| CALIBRATION NUMBER | #1 | #2 | ... | #41 | #42 | ... | #60 | #61 | ... | #99 | #100 |
|---|---|---|---|---|---|---|---|---|---|---|---|
| CPU TEMPERATURE(Deg-C) | 40.0 | 40.5 | ... | 60.0 | 60.5 | ... | 69.5 | 70.0 | ... | 89.5 | 90.0 |
| AIR VOLUME(CFM) | 0.05 | 0.05 | ... | 0.11 | 0.11 | ... | 0.12 | 0.13 | ... | 0.20 | 0.20 |
| APPROXIMATION PROCESSING FLAG | 0 | 0 | ... | 0 | 0 | ... | 0 | 0 | ... | 0 | 0 |

FIG. 12A

MEASUREMENT VALUE DB

102

| MEASUREMENT NUMBER | #1 | #2 | ... | #12 |
|---|---|---|---|---|
| CPU TEMPERATURE(Deg-C) | 60.0 | 0.0 | ... | 0.0 |
| AIR VOLUME(CFM) | 0.15 | 0.00 | ... | 0.00 |
| DETERMINATION RESULT | NG | 0 | ... | 0 |

A1 circles column #1 (60.0, 0.15, NG)

FIG. 12B

CALIBRATION VALUE DB

101

| CALIBRATION NUMBER | #1 | #2 | ... | #41 | #42 | ... | #60 | #61 | ... | #99 | #100 |
|---|---|---|---|---|---|---|---|---|---|---|---|
| CPU TEMPERATURE(Deg-C) | 40.0 | 40.5 | ... | 60.0 | 60.5 | ... | 69.5 | 70.0 | ... | 89.5 | 90.0 |
| AIR VOLUME(CFM) | 0.05 | 0.05 | ... | 0.11 | 0.11 | ... | 0.12 | 0.13 | ... | 0.20 | 0.20 |
| APPROXIMATION PROCESSING FLAG | 0 | 0 | ... | 0 | 0 | ... | 0 | 0 | ... | 0 | 0 |

A2 circles column #41 (60.0, 0.11, 0)

FIG. 13A

MEASUREMENT VALUE DB

|  | #1 | #2 | ... | #12 |
|---|---|---|---|---|
| MEASUREMENT NUMBER |  |  |  |  |
| CPU TEMPERATURE(Deg-C) | 60.0 | 69.7 | ... | 0.0 |
| AIR VOLUME(CFM) | 0.15 | 0.13 | ... | 0.00 |
| DETERMINATION RESULT | NG | OK | ... | 0 |

(B1 circles column #2)

FIG. 13B

CALIBRATION VALUE DB

| CALIBRATION NUMBER | #1 | #2 | ... | #41 | #42 | ... | #60 | #61 | #62 | ... | #100 | #101 |
|---|---|---|---|---|---|---|---|---|---|---|---|---|
| CPU TEMPERATURE(Deg-C) | 40.0 | 40.5 | ... | 60.0 | 60.5 | ... | 69.5 | 69.7 | 70.0 | ... | 89.5 | 90.0 |
| AIR VOLUME(CFM) | 0.05 | 0.05 | ... | 0.11 | 0.11 | ... | 0.12 | 0.13 | 0.13 | ... | 0.20 | 0.20 |
| APPROXIMATION PROCESSING FLAG | 0 | 0 | ... | 0 | 0 | ... | 0 | 1 | 0 | ... | 0 | 0 |

(B2 circles column #61)

FIG. 14

CALIBRATION PARAMETER DB

| ADDITIONAL PARAMETER NUMBER | #1 | #2 | #3 | · · · |
|---|---|---|---|---|
| CPU TEMPERATURE(Deg-C) | 69.7 | 0 | 0 | · · · |

CALIBRATION VALUE DB                                              101

| | | | | |
|---|---|---|---|---|
| CALIBRATION NUMBER | 0 | 0 | 0 | ... |
| CPU TEMPERATURE(Deg-C)      :D1(a) | 0 | 0 | 0 | ... |
| AIR VOLUME(CFM)             :D2(a) | 0 | 0 | 0 | ... |
| APPROXIMATION PROCESSING FLAG :D3(a) | 0 | 0 | 0 | ... |

FIG. 19B

MEASUREMENT VALUE DB                                              102a

| | | | | |
|---|---|---|---|---|
| MEASUREMENT NUMBER | 0 | 0 | 0 | ... |
| CPU TEMPERATURE(Deg-C)        :D1(b) | 0 | 0 | 0 | ... |
| AIR VOLUME(CFM)               :D2(b) | 0 | 0 | 0 | ... |
| MAINTENANCE OPERATION FACTOR  :D3(b) | 0 | 0 | 0 | ... |
| DETERMINATION RESULT          :D4(b) | 0 | 0 | 0 | ... |

FIG. 19C

CALIBRATION PARAMETER DB                                          103

| | | | | |
|---|---|---|---|---|
| ADDITIONAL PARAMETER NUMBER | 0 | 0 | 0 | ... |
| CPU TEMPERATURE(Deg-C) :D1(c) | 0 | 0 | 0 | ... |

FIG. 19D

USER SETTING PARAMETER DB                                         104a

| | |
|---|---|
| TEMPERATURE INTERVAL VALUE              :D1(d) | 0 |
| WEIGHTING OF ACTUAL MEASUREMENT VALUE   :D2(d) | 0 |
| WEIGHTING OF APPROXIMATE VALUE          :D3(d) | 0 |
| WEIGHTING OF MAINTENANCE OPERATION FACTOR :D4(d) | 0 |
| INTERVAL TIME                           :D5(d) | 0 |
| DIFFERENCE ALLOWABLE RANGE(%)           :D6(d) | 0 |
| DIFFERENCE CHANGE RATIO ALLOWABLE RANGE(%) :D7(d) | 0 |

FIG. 20

| DIFFERENCE DB | | | | 105 |
|---|---|---|---|---|
| MEASUREMENT NUMBER | 0 | 0 | 0 | ・・・ |
| CPU TEMPERATURE(Deg-C)   :D1(e) | 0 | 0 | 0 | ・・・ |
| DIFFERENCE(%)   :D2(e) | 0 | 0 | 0 | ・・・ |
| DIFFERENCE CHANGE RATIO(%) :D3(e) | 0 | 0 | 0 | ・・・ |

INFORMATION PROCESSING APPARATUS HAVING DUST-PROOF BEZEL AND INFORMATION PROCESSING METHOD USING THE SAME

CROSS-REFERENCE TO RELATED APPLICATIONS

This application is based upon and claims the benefit of priority of the prior Japanese Patent Application No. 2019-075035, filed on Apr. 10, 2019, and the prior Japanese Patent Application No. 2018-129242, filed on Jul. 6, 2018, the entire contents of which are incorporated herein by reference.

FIELD

The embodiments discussed herein are related to an information processing apparatus and an information processing method.

BACKGROUND

In some cases, a bezel (also called a "front bezel" or a "dust-proof bezel") may be provided in front of a casing of a server in order to prevent dust or dirt from entering the casing. The bezel has a filter-shaped surface, and also has a function of discharging heat within the casing by an air flow generated by a fan provided within the casing of the server.

When the bezel is clogged due to dirt, etc., there is a concern that a heat exhaust efficiency in the casing of the server may be lowered, and then the server may be broken.

Therefore, there has been known a technology of comparing an air volume measured by an air volume sensor provided near the bezel in the casing of the server, to a reference value, so that the clogging of the bezel is detected when the air volume falls below the reference value.

Related techniques are disclosed in, for example, Japanese Laid-open Patent Publication No. 2012-066190 and Japanese Laid-open Patent Publication No. 2013-201304.

However, when the air volume is measured, the CPU temperature of the server has to be kept constant. Also, since many factors that cause a change of the air volume may be taken into consideration, it is difficult to determine that the bezel is clogged simply because the measured air volume falls below the reference value.

SUMMARY

According to an aspect of the embodiments, an information processing apparatus includes: a fan that cools a first processor; a dust-proof bezel that prevents foreign matter from entering a casing; a memory; and a second processor coupled to the memory and the second processor configured to: measure a temperature of the first processor and an air volume of an air flow which passes through the dust-proof bezel; compare a registered air volume to the measured air volume when the measured temperature matches a registered temperature included in comparison information stored in the memory, the registered air volume being included in the comparison information in association with the matched temperature, the comparison information including a registered temperature of the first processor and a registered air volume of an air flow generated by the fan in association with each other; and determine abnormality in the dust-proof bezel based on a result of the comparison.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 4A to 4D illustrate tables indicating a calibration value database (DB), a measurement value DB, a calibration parameter DB, and a user setting parameter DB in the monitoring target server illustrated in FIG. 2;

FIG. 5 is a sequence diagram illustrating a clogging detection processing of a dust-proof bezel in the monitoring target server illustrated in FIG. 2;

FIG. 6 is a sequence diagram illustrating the clogging detection processing of the dust-proof bezel in the monitoring target server illustrated in FIG. 2;

FIG. 7 is a sequence diagram illustrating the clogging detection processing of the dust-proof bezel in the monitoring target server illustrated in FIG. 2;

FIG. 10 is a table indicating a specific example of registration contents in the user setting parameter DB illustrated in FIGS. 4A to 4D;

FIGS. 11A and 11B illustrate tables indicating specific examples of registration contents in the calibration value DB illustrated in FIGS. 4A to 4D;

FIGS. 12A and 12B illustrate tables indicating a first comparison example in the measurement value DB and the calibration value DB illustrated in FIGS. 4A to 4D;

FIGS. 13A and 13B illustrate tables indicating a second comparison example in the measurement value DB and the calibration value DB illustrated in FIGS. 4A to 4D;

FIG. 14 is a table indicating a specific example of registration contents in the calibration parameter DB illustrated in FIGS. 4A to 4D;

FIGS. 19A to 19D illustrate tables indicating a calibration value DB, a measurement value DB, a calibration parameter DB, and a user setting parameter DB in a monitoring target server illustrated in FIG. 17;

FIG. 20 is a table indicating a difference DB in the monitoring target server illustrated in FIG. 17;

DESCRIPTION OF EMBODIMENTS

Figure 1:
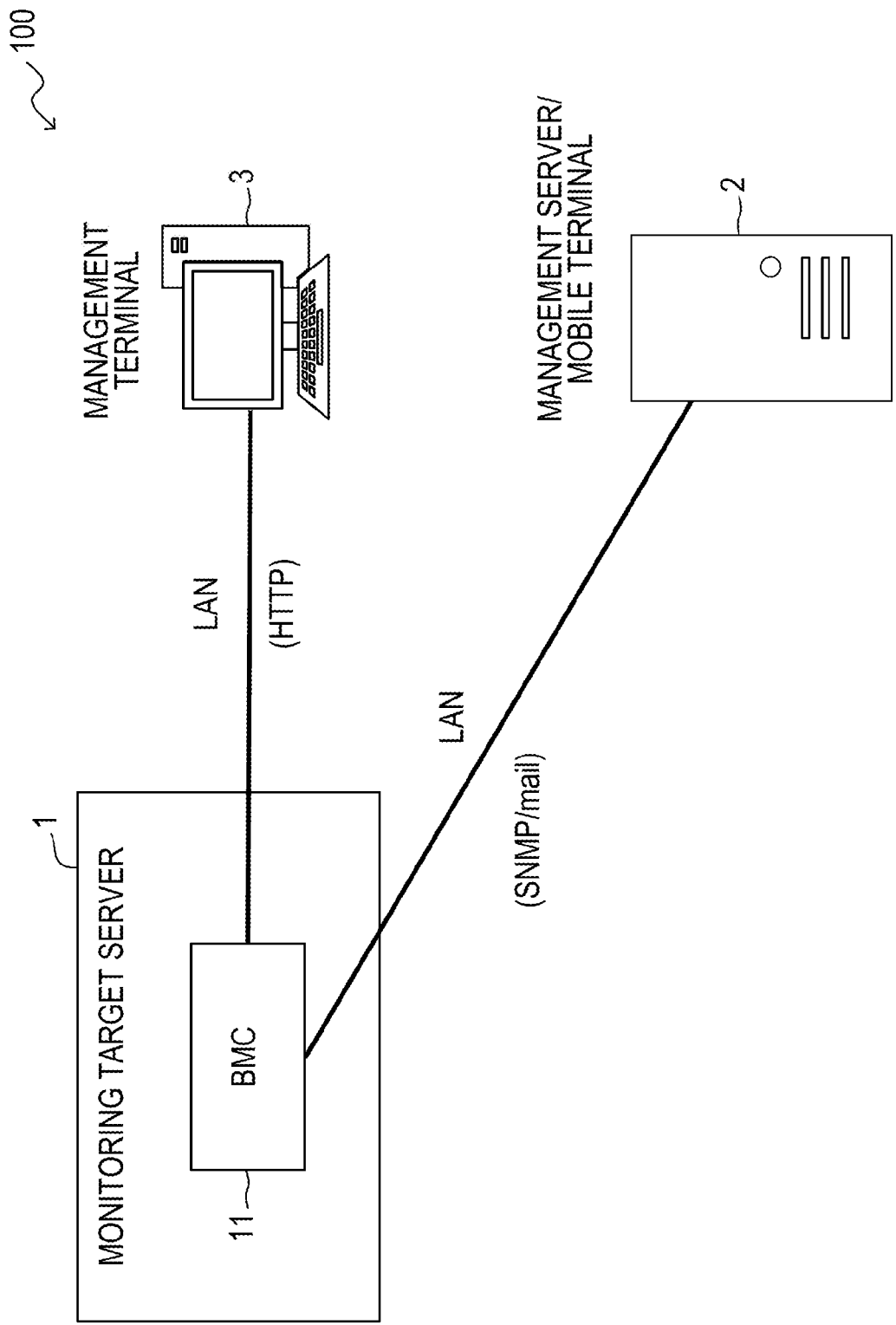
FIG. 1 is a block diagram schematically illustrating a configuration of an information processing system as an example of a first embodiment.

Hereinafter, embodiments will be described with reference to the accompanying drawings. Meanwhile, the embodiments described below are merely exemplary, and there is no intention to exclude the application of various modifications or techniques not specified in the embodiments. That is, the embodiments may be implemented through various modifications without departing from the scope of the gist thereof.

Each drawing is not intended to include only constitutional elements illustrated in the drawing, but may include other functions, etc.

Hereinafter, in the drawings, the same reference numerals indicate the same portions, and thus, the descriptions thereof will be omitted.

(A) Example of First Embodiment (A-1) System Configuration Example

FIG. 1 is a block diagram schematically illustrating a configuration of an information processing system 100 as an example of a first embodiment.

The information processing system 100 includes a monitoring target server 1, a management server/mobile terminal 2, and a management terminal 3.

The management server/mobile terminal 2 may be connected to the monitoring target server 1 via a local area network (LAN) by using a simple network management protocol (SNMP), an e-mail, etc. The management server/mobile terminal 2 may remotely monitor the monitoring target server 1. When a plurality of monitoring target servers 1 is provided in the information processing system 100, the management server/mobile terminal 2 may collectively monitor the plurality of monitoring target servers 1. In the embodiment, the management server/mobile terminal 2 receives a notification of clogging of a dust-proof bezel 16 detected in the monitoring target server 1 (described below with reference to FIG. 2), and notifies a user such as a customer engineer (CE) 4 (described below with reference to FIG. 5, etc.) about the clogging of the dust-proof bezel 16.

The management terminal 3 may be connected to the monitoring target server 1 via a LAN by using a hypertext transfer protocol (HTTP). The management terminal 3 is connected to the monitoring target server 1 in a one-to-one relationship, and is capable of monitoring various measurement results in the monitoring target server 1. In the embodiment, the management terminal 3 receives a notification of clogging of the dust-proof bezel 16 detected in the monitoring target server 1 (described below with reference to FIG. 2), and notifies the user such as the CE 4 (described below with reference to FIG. 5 etc.) about the clogging of the dust-proof bezel 16.

The monitoring target server 1 includes a baseboard management controller (BMC) 11. The BMC 11 detects clogging in the dust-proof bezel 16 as described below with reference to FIG. 3, etc.

Figure 2:
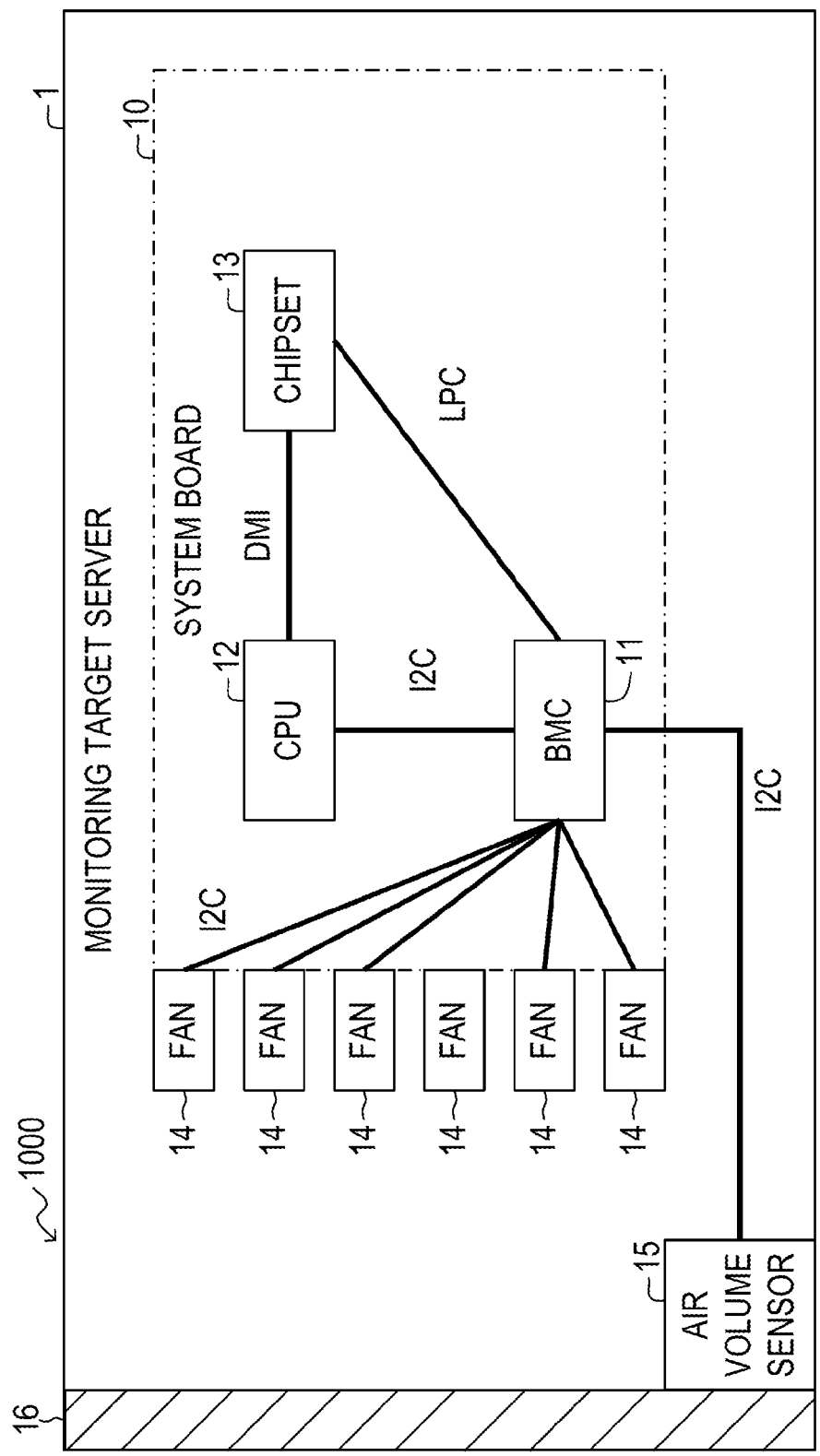
FIG. 2 is a block diagram schematically illustrating a hardware configuration of a monitoring target server in the information processing system illustrated in FIG. 1.

FIG. 2 is a block diagram schematically illustrating a hardware configuration of the monitoring target server 1 in the information processing system 100 illustrated in FIG. 1.

The monitoring target server 1 includes a system board 10, a plurality (six in the illustrated example) of cooling fans (FAN) 14, an air volume sensor 15, and the bezel 16 (also called a "dust-proof bezel" or a "front bezel"). In FIG. 2, the reference numeral "1000" indicates a casing of the monitoring target server 1.

The cooling fan 14 generates an air flow in order to cool the heat within the casing 1000.

The air volume sensor 15 measures an air volume of an air flow passing through the dust-proof bezel 16 among the air volumes in the air flows generated by the cooling fans 14.

The dust-proof bezel 16 has a filter-shaped surface, and is provided in front of the casing 1000 of the monitoring target server 1 in such a manner that the dust-proof bezel 16 is detachable from the casing 1000. When an abnormality such as clogging has occurred due to dust, dirt etc. in the dust-proof bezel 16, the dust-proof bezel 16 may be replaced by a new dust-proof bezel 16 by the user.

The system board 10 includes the BMC 11, a central processing unit (CPU) 12, and a chipset 13.

The chipset 13 is a combination of a plurality of integrated circuits that implements various functions in the monitoring target server 1. The chipset 13 may be connected to the BMC 11 by a low pin count (LPC) bus and may be connected to the CPU 12 by a direct media interface (DMI).

The CPU 12 is an example of a first processor. The CPU 12 is, for example, a processing device that performs various controls or calculations in the monitoring target server 1, and implements various functions by executing, for example, an Operating System (OS) or a program stored in a memory (not illustrated) within the chipset 13.

The BMC 11 is an example of a second processor. The BMC 11 monitors an air volume by the air volume sensor 15 provided near the dust-proof bezel 16 of the monitoring target server 1, and monitors the temperature of the CPU 12. The BMC 11 may be connected to the CPU 12, each of the cooling fans 14, and the air volume sensor 15 by an inter-integrated circuit I2C.

Figure 3:
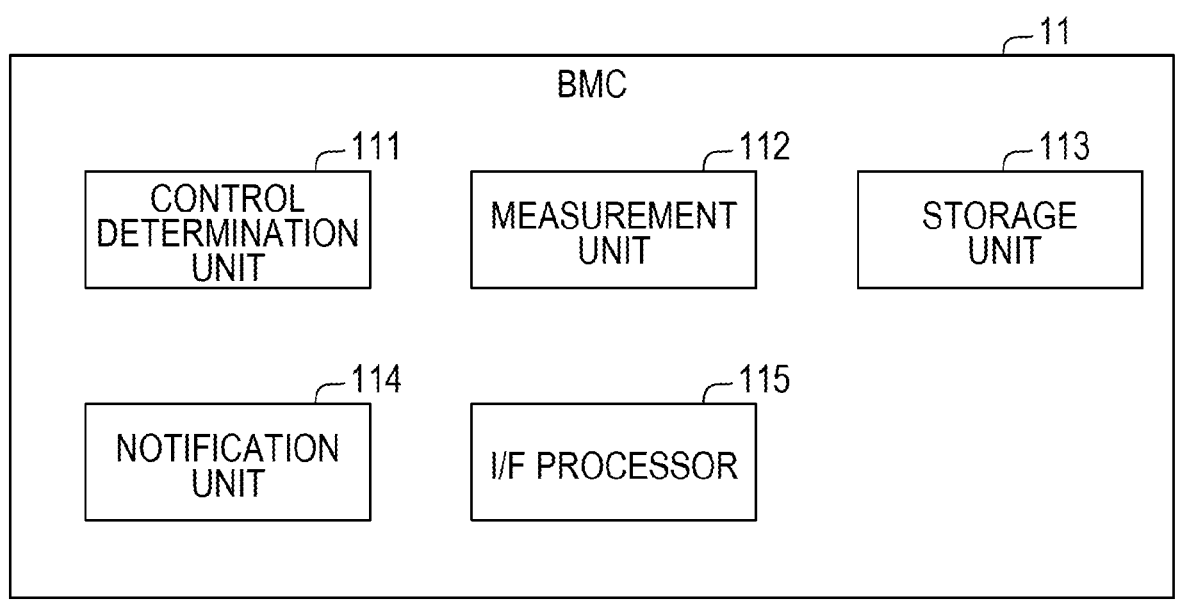
FIG. 3 is a view schematically illustrating a functional configuration of the monitoring target server illustrated in FIG. 2.

FIG. 3 is a view schematically illustrating a functional configuration of the monitoring target server 1 illustrated in FIG. 2.

The BMC 11 functions as, for example, a control determination unit 111, a measurement unit 112, a storage unit 113, a notification unit 114, and an interface (I/F) processor 115.

The control determination unit 111 performs a comparison and a determination of information such as the temperature of the CPU 12 acquired by an intelligent platform management bus (IPMB) interface or an air volume acquired by the air volume sensor 15, and performs a control of the cooling fans 14.

That is, the control determination unit 111 is an example of a determination unit that compares a calibration value DB 101 (described below with reference to FIG. 4A, etc.) to a measurement value DB 102 (described below with reference to FIG. 4B, etc.), and determines an abnormality such as clogging in the dust-proof bezel 16. Details of a processing in the control determination unit 111 will be described below with reference to FIGS. 4A to 4D, etc.

The measurement unit 112, via the I2C interface, measures an air volume within the casing 1000 by using the air volume sensor 15, and measures the temperature of the CPU 12.

That is, the measurement unit 112 measures a relationship between the temperature of the CPU 12 and the air volume of an air flow which passes through the dust-proof bezel 16, as the measurement value DB 102.

As described below with reference to FIGS. 4A to 4D, the storage unit 113 includes a storage area that stores information on the calibration value DB 101, the measurement value DB 102, a calibration parameter DB 103, and a user setting parameter DB 104.

That is, the storage unit 113 has a storage area that stores the calibration value DB 101 in which the temperature of the CPU 12 and an air volume of an air flow generated by the cooling fans 14 are registered in association with each other.

When the control determination unit 111 determines that an abnormality such as clogging has occurred in the dust-proof bezel 16, the notification unit 114 notifies the user about the occurrence of the abnormality via the I/F processor 115.

The I/F processor 115 controls communication between the BMC 11 and other devices.

FIG. 4A is a table indicating the calibration value DB 101.

The calibration value DB 101 is an example of comparison information in which the temperature of the CPU 12 and an air volume of an air flow generated by the cooling fans 14 are registered in association with each other. In the calibration value DB 101, a calibration number, a CPU temperature, an air volume, and an approximation processing flag are registered. As illustrated, all values in the calibration value DB 101 may be "0" at the initial state.

The calibration number is a number that identifies each combination of a CPU temperature and an air volume. In the calibration number, values of #1 to #N (N is a natural number of 2 or more) may be registered.

In the CPU temperature, a temperature that the CPU 12 may take is registered, and the unit may be, for example, ° C.

In the air volume, a predicted value of an air volume of the air flow generated by the cooling fans 14 is registered when a corresponding CPU temperature is measured, and the unit is, for example, cubic feet per minute (CFM).

A relationship between a CPU temperature and an air volume may be registered on the basis of an actually measured past value. Meanwhile, when an air volume corresponding to a CPU temperature that is not actually measured in the past is registered in the calibration value DB 101, "1" is set in an approximate value flag.

FIG. 4B is a table indicating the measurement value DB 102.

The measurement value DB 102 holds a relationship between the temperature of the CPU 12 and an air volume of an air flow which passes through the dust-proof bezel 16. In the measurement value DB 102, a measurement number, a CPU temperature, an air volume, and a determination result are registered. As illustrated, all values in the measurement value DB 102 may be "0" at the initial state.

The measurement number is a number that identifies each combination of a CPU temperature and an air volume. In the measurement number, values of #1 to #M (M is a natural number of 2 or more) may be registered.

In the CPU temperature, the temperature of the CPU 12 measured by the measurement unit 112 is registered, and the unit may be, for example, ° C.

In the air volume, an air volume measured using the air volume sensor 15 is registered when a corresponding CPU temperature is measured, and the unit is, for example, cubic feet per minute (CFM).

In the determination result, "OK" is registered when a combination of a CPU temperature and an air volume in the measurement value DB 102 matches a combination of a CPU temperature and an air volume in the calibration value DB 101. Meanwhile, in the determination result, "NG" is registered when a combination of a CPU temperature and an air volume in the measurement value DB 102 does not match a combination of a CPU temperature and an air volume in the calibration value DB 101.

When the temperature of the CPU 12 in the measurement value DB 102 does not match the temperature of the CPU 12 in the calibration value DB 101, the control determination unit 111 may calculate an approximate value of an air volume registered in the calibration value DB 101. Then, the control determination unit 111 may determine an abnormality in the dust-proof bezel 16 by comparing the calculated approximate value to a measured air volume.

The control determination unit 111 may cause the storage unit 113 to store the calculated approximate value as an air volume at the temperature of the CPU 12 in the measurement value DB 102, in addition to the calibration value DB 101.

The control determination unit 111 may determine that the dust-proof bezel 16 is abnormal when the number of times where the calibration value DB 101 and the measurement value DB 102 match each other is equal to or less than the number of times where the calibration value DB 101 and the measurement value DB 102 do not match each other.

FIG. 4C is a table indicating the calibration parameter DB 103.

The calibration parameter DB 103 holds a CPU temperature additionally registered in the calibration value DB 101. As illustrated, all values in the calibration parameter DB 103 may be "0" at the initial state.

An additional parameter number is a number that identifies an added CPU temperature. In the additional parameter number, values of #1 to #M (M is a natural number of 2 or more) may be registered.

In the CPU temperature, the temperature of the CPU 12 newly registered in the calibration value DB 101 is registered, and the unit may be, for example, ° C.

FIG. 4D is a table indicating the user setting parameter DB 104.

The user setting parameter DB 104 holds various values set by the user.

A temperature interval value indicates an interval of CPU temperatures registered in the calibration value DB 101.

The weighting of an actual measurement value is an example of a first weighting value, and is a value used when the temperature of the CPU 12 in the measurement value DB 102 matches the temperature of the CPU 12 in the calibration value DB 101.

The weighting of an approximate value is an example of a second weighting value, and is a value used when the temperature of the CPU 12 in the measurement value DB 102 does not match the temperature of the CPU 12 in the calibration value DB 101.

An interval time indicates an interval at which a clogging detection processing is performed at the dust-proof bezel 16.

The storage unit 113 has a storage area that stores the weighting of an actual measurement value for a case where the temperature of the CPU 12 in the measurement value DB 102 matches the temperature of the CPU 12 registered in the calibration value DB 101. The storage unit 113 has a storage area that stores the weighting of an approximate value for a case where the temperature of the CPU 12 in the measurement value DB 102 does not match the temperature of the CPU 12 registered in the calibration value DB 101. Then, the control determination unit 111 may determine that the dust-proof bezel 16 is abnormal when a value obtained by multiplying the number of times where the calibration value DB 101 and the measurement value DB 102 match each other by the weighting of the actual measurement value or the weighting of the approximate value, is equal to or less than a value obtained by multiplying the number of times where the calibration value DB 101 and the measurement value DB 102 do not match each other by the weighting of the actual measurement value or the weighting of the approximate value.

(A-2) Operation Example

Figure 8:
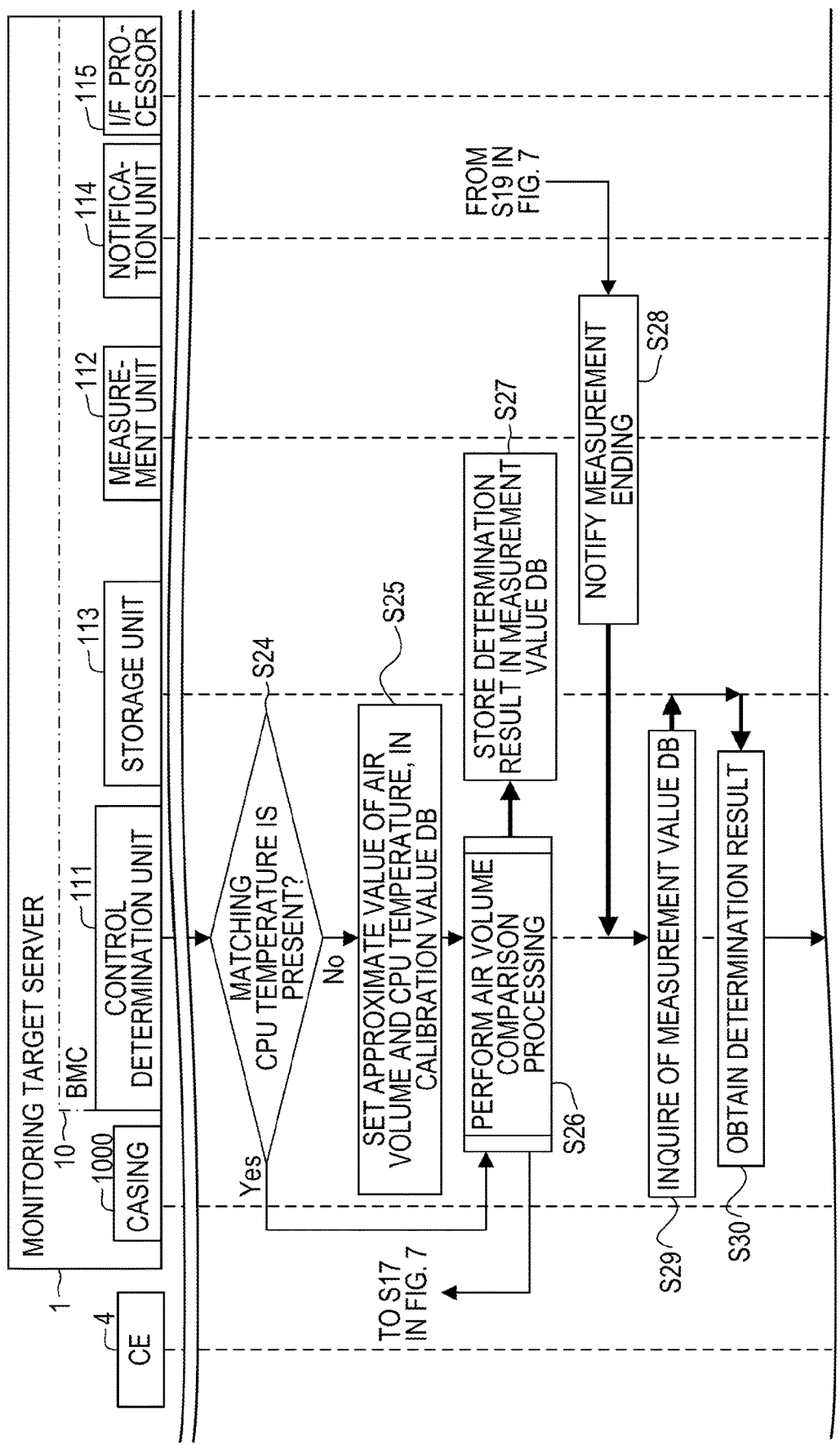
FIG. 8 is a sequence diagram illustrating the clogging detection processing of the dust-proof bezel in the monitoring target server illustrated in FIG. 2.
Figure 9:
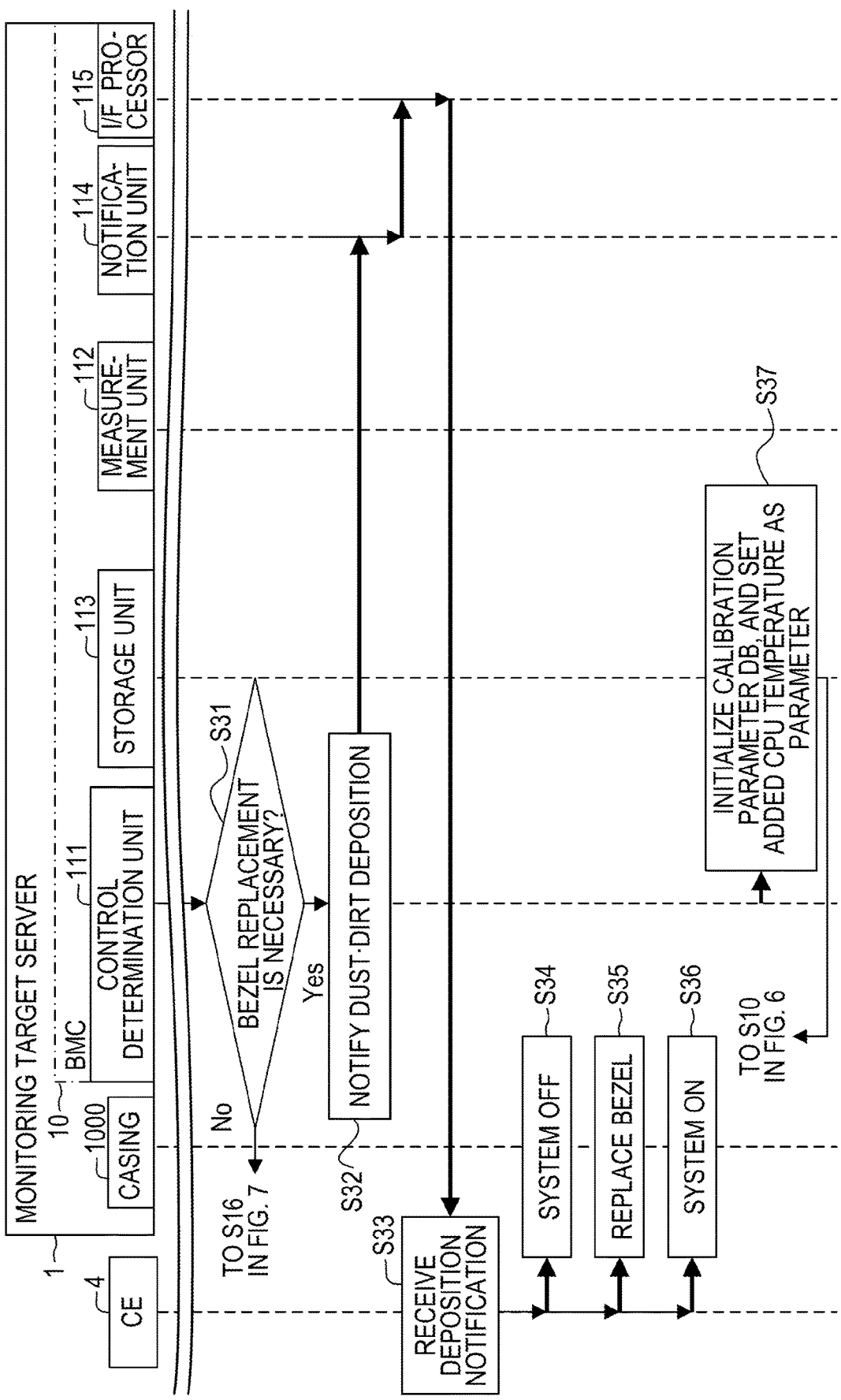
FIG. 9 is a sequence diagram illustrating the clogging detection processing of the dust-proof bezel in the monitoring target server illustrated in FIG. 2.

Descriptions will be made on a clogging detection processing of the dust-proof bezel 16 in the monitoring target server 1 illustrated in FIG. 2 in accordance with sequence diagrams illustrated in FIGS. 5 to 9 (steps S1 to S37) with reference to tables illustrated in FIGS. 10 to 14. FIG. 5 illustrates a processing in steps S1 to S8, FIG. 6 illustrates a processing in steps S9 to S15, FIG. 7 illustrates a processing in steps S16 to S23, FIG. 8 illustrates a processing in steps S24 to S30, and FIG. 9 illustrates a processing in steps S31 to S37.

FIG. 10 is a table indicating a specific example of registration contents in the user setting parameter DB 104 illustrated in FIGS. 4A to 4D. FIG. 11A is a table indicating a registration example of CPU temperatures in the calibration value DB 101 illustrated in FIGS. 4A to 4D, and FIG. 11B is a table indicating a registration example of CPU temperatures and air volumes in the calibration value DB 101 illustrated in FIGS. 4A to 4D. FIGS. 12A and 12B illustrate tables indicating a first comparison example in the measurement value DB 102 and the calibration value DB 101 illustrated in FIGS. 4A to 4D, and FIGS. 13A and 13B illustrate tables indicating a second comparison example in the measurement value DB 102 and the calibration value DB 101 illustrated in FIGS. 4A to 4D. FIG. 14 is a table indicating a specific example of registration contents in the calibration parameter DB 103 illustrated in FIGS. 4A to 4D.

As illustrated in FIG. 5, the CE 4 mounts the dust-proof bezel 16 on the casing 1000 of the monitoring target server 1 (step S1 in FIG. 5).

The CE 4 powers ON the system, in the casing 1000 of the monitoring target server 1 (step S2 in FIG. 5).

As illustrated in each of FIGS. 4A and 4B, the control determination unit 111 initializes the calibration value DB 101 and the measurement value DB 102 in the storage unit 113 (step S3 in FIG. 5).

As illustrated in FIG. 4C, the control determination unit 111 initializes the calibration parameter DB 103 in the storage unit 113 (step S4 in FIG. 5).

As illustrated in FIG. 4D, the control determination unit 111 initializes the user setting parameter DB 104 in the storage unit 113 (step S5 in FIG. 5).

The control determination unit 111 sets various parameters in the user setting parameter DB 104 (step S6 in FIG. 5).

In the example illustrated in FIG. 10, in the user setting parameter DB 104, the temperature interval value is set to "0.5," the weighting of the actual measurement value is set to "5," the weighting of the approximate value is set to "1," and the interval time is set to "7200 sec."

When the weighting of the actual measurement value is set to "5," as the weighting of the approximate value, values of "1" to "4" may be set according to the granularity of the temperature interval value.

When the interval time is "7200 sec," the clogging detection processing of the dust-proof bezel 16 is performed 12 times a day at an interval of once every two hours. For example, when it is determined that clogging has not occurred in the dust-proof bezel 16 in half or more of twelve clogging detection processings in a day, the clogging detection processing may not be executed for a predetermined time. Accordingly, it is possible to reduce a load in the monitoring target server 1.

The control determination unit 111 receives a DB setting completion notification from the storage unit 113 (step S7 in FIG. 5).

The control determination unit 111 starts a calibration value setting processing (step S8 in FIG. 5).

As illustrated in FIG. 6, the control determination unit 111 sets a plurality of CPU temperatures in the calibration value DB 101 in the storage unit 113 (step S9 in FIG. 6).

In the example illustrated in FIG. 11A, in the calibration value DB 101, calibration numbers of "#1" to "#100" are set. Then, in the calibration value DB 101, CPU temperatures "40.0° C." to "90.0° C." are set for the calibration numbers, respectively, at an interval of "0.5° C." that is the temperature interval value in the user setting parameter DB 104 illustrated in FIG. 10.

The control determination unit 111 inquires of the calibration value DB 101 in the storage unit 113 about a parameter value for each CPU temperature (step S10 in FIG. 6).

The control determination unit 111 obtains the parameter value from the calibration value DB 101 in the storage unit 113 (step S11 in FIG. 6).

The control determination unit 111 performs a control of the cooling fans 14 (step S12 in FIG. 6).

The control determination unit 111 determines whether a variable k (k is a natural number of 0 or more and n or less) has reached the number n of calibration values registered in the calibration value DB 101 (step S13 in FIG. 6).

When it is determined that the variable k has not reached the number n of calibration values (see "No" route in step S13 in FIG. 6), an air volume measured for each CPU temperature is set in the calibration value DB 101 (step S14 in FIG. 6). Then, the control determination unit 111 increments the variable "k," by "1," and the processing returns to step S13 in FIG. 6.

In the example illustrated in FIG. 11B, in the calibration value DB 101, in addition to the calibration numbers and the CPU temperature values, air volume values are registered. For example, when the calibration number is "#1," and the CPU temperature is "40.0° C.," the air volume "0.05 CFM" is registered, and when the calibration number is "#41" and the CPU temperature is "60.0° C.," the air volume "0.11 CFM" is registered.

Meanwhile, when it is determined that the variable k has reached the number n of calibration values (see "Yes" route in step S13 in FIG. 6), the control determination unit 111 ends setting of the calibration values in the calibration value DB 101 (step S15 in FIG. 6).

As illustrated in FIG. 7, the control determination unit 111 initializes the current number of times of measurement j to "0" (step S16 in FIG. 7).

The control determination unit 111 requests the measurement unit 112 to perform a measurement processing of a CPU temperature and an air volume (step S17 in FIG. 7).

The measurement unit 112 measures a CPU temperature and an air volume (step S18 in FIG. 7).

The measurement unit 112 determines whether the number of times of measurement j has reached the maximum value m of the number of times of measurement (step S19 in FIG. 7).

When it is determined that the number of times of measurement j has reached the maximum value m of the number of times of measurement (see "Yes" route in step S19 in FIG. 7), the processing proceeds to step S28 in FIG. 8.

Meanwhile, when it is determined that the number of times of measurement j has not reached the maximum value m of the number of times of measurement (see "No" route in step S19 in FIG. 7), the measurement unit 112 stores the measured CPU temperature and the measured air volume in the measurement value DB 102 in the storage unit 113 (step S20 in FIG. 7).

The measurement unit 112 notifies the control determination unit 111 of measurement execution (step S21 in FIG. 7). Then, the processing returns to step S19 in FIG. 7.

When the notification of the measurement execution is received from the measurement unit 112, the control determination unit 111 inquires of the measurement value DB 102 in the storage unit 113 (step S22 in FIG. 7).

The control determination unit 111 obtains the measurement value from the measurement value DB 102 in the storage unit 113 (step S23 in FIG. 7).

As illustrated in FIG. 8, the control determination unit 111 determines whether a CPU temperature that matches the CPU temperature in the measurement value DB 102 exists in the calibration value DB 101 (step S24 in FIG. 8).

When it is determined that there is a matching CPU temperature (see "Yes" route in step S24 in FIG. 8), the processing proceeds to step S26 in FIG. 8.

Meanwhile, when it is determined that there is no matching CPU temperature (see "No" route in step S24 in FIG. 8), the control determination unit 111 sets an approximate value of the air volume and the CPU temperature in the calibration value DB 101 (step S25 in FIG. 8).

The control determination unit 111 performs a comparison processing between the air volume in the calibration value DB 101 and the air volume in the measurement value DB 102 (step S26 in FIG. 8). Then, the processing returns to step S17 in FIG. 7.

In the example illustrated in FIG. 12A, in the measurement value DB 102, when the measurement number is "#1" and the CPU temperature is "60.0° C.," the air volume is "0.15 CFM" (see reference numeral A1). Meanwhile, in the example illustrated in FIG. 12B, in the calibration value DB 101, when the measurement number is "#41" and the CPU temperature is "60.0° C.," the air volume is "0.11 CFM" (see reference numeral A2). In this manner, since the air volume of the measurement value DB 102 does not match the air volume of the calibration value DB 101 at the same CPU temperatures, "NG" is registered in the determination result for the measurement number "#1" in the measurement value DB 102.

In the example illustrated in FIG. 13A, in the measurement value DB 102, the CPU temperature for the measurement number "#2" is "69.7° C." (see reference numeral B1). Meanwhile, in the example illustrated in FIG. 11B, in the calibration value DB 101, there is no calibration value for a case where the CPU temperature is "69.7° C." Therefore, as illustrated in FIG. 13B, for the calibration number "#61," "0.13 CFM" is registered as an approximate value of the air volume for a case where the CPU temperature is "69.7° C." (see reference numeral B2). Since the calibration number "#61" is a calibration value added by an approximation processing, "1" is set to the approximation processing flag. The calibration numbers "#61" to "#100" in FIG. 11B are updated with the calibration numbers "#62" to "#101" in the example illustrated in FIG. 13B.

In the example illustrated in FIGS. 13A and 13B, since the air volume of the measurement value DB 102 matches the air volume of the calibration value DB 101 at the same CPU temperatures, "OK" is registered in the determination result for the measurement number "#2" in the measurement value DB 102.

Details of the air volume comparison processing in step S26 in FIG. 8 will be described below with reference to flow charts in FIGS. 15A and 15B.

The control determination unit 111 stores the determination result in the air volume comparison processing, in the measurement value DB 102 in the storage unit 113 (step S27 of FIG. 8).

The measurement unit 112 notifies the control determination unit 111 of the end of measurement (step S28 in FIG. 8).

When the notification of the end of measurement is received from the measurement unit 112, the control determination unit 111 inquires of the measurement value DB 102 in the storage unit 113 (step S29 in FIG. 8).

The control determination unit 111 obtains the determination result from the measurement value DB 102 in the storage unit 113 (step S30 in FIG. 8).

As illustrated in FIG. 9, the control determination unit 111 comprehensively determines whether it is necessary to replace the dust-proof bezel 16, on the basis of the result of the air volume comparison processing illustrated in step S26 in FIG. 8 (step S31 in FIG. 9). Details of the bezel replacement necessity determination in step S31 in FIG. 9 will be described below with reference to a flow chart in FIG. 16.

When it is unnecessary to replace the dust-proof bezel 16 (see "No" route in step S31 in FIG. 9), the processing returns to step S16 in FIG. 7.

Meanwhile, when it is necessary to replace the dust-proof bezel 16 (See "Yes" route in step S31 in FIG. 9), the control determination unit 111 notifies the notification unit 114 of deposition of dust, dirt, etc. in the dust-proof bezel 16 (step S32 in FIG. 9).

The notification unit 114 notifies the CE 4 of the deposition of dust or dirt in the dust-proof bezel 16 via the I/F processor 115. Then, the CE 4 receives the notification of the deposition of dust or dirt in the dust-proof bezel 16 (step S33 in FIG. 9).

The CE 4 performs a power-OFF operation of the system, in the casing 1000 of the monitoring target server 1 (step S34 in FIG. 9).

The CE 4 replaces the dust-proof bezel 16, in the casing 1000 of the monitoring target server 1 (step S35 in FIG. 9).

The CE 4 performs a power-ON operation of the system, in the casing 1000 of the monitoring target server 1 (step S36 in FIG. 9).

The control determination unit 111 initializes the calibration parameter DB 103 in the storage unit 113, and sets the actually measured value of the air volume corresponding to the CPU temperature for which the approximate value of the air volume is calculated, as a parameter value in the calibration value DB 101 (step S37 in FIG. 9). Then, the processing returns to step S10 in FIG. 6.

In the example illustrated in FIG. 14, in the calibration parameter DB 103, for the additional parameter number "#1," the CPU temperature "69.7° C." is registered. Therefore, in the calibration value DB 101, the actually measured value of the air volume at the CPU temperature "69.7° C." is added as the parameter value.

Next, details of the air volume comparison processing illustrated in step S26 in FIG. 8 will be described in accordance with flow charts illustrated in FIGS. 15A and 15B (steps S261 to S263 and S266 to S269).

Figure 15A:
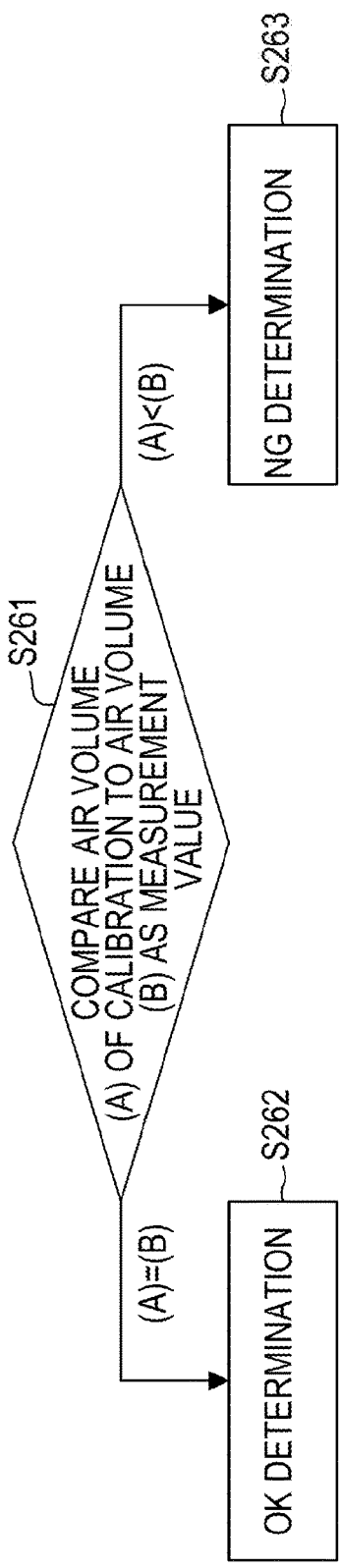
FIGS. 15A and 15B illustrate flow charts illustrating details of an air volume comparison processing illustrated in FIG. 8.

FIG. 15A illustrates details of the air volume comparison processing in a case where the CPU temperature in the calibration value DB 101 matches the CPU temperature in the measurement value DB 102 (steps S261 to S263). FIG. 15B illustrates details of the air volume comparison processing in a case where the CPU temperature in the calibration value DB 101 does not match the CPU temperature in the measurement value DB 102 (steps S266 to S269).

As illustrated in FIG. 15A, the control determination unit 111 compares an air volume (A) in the calibration value DB 101 to an air volume (B) in the measurement value DB 102 (step S261 in FIG. 15A).

When the air volume (A) in the calibration value DB 101 is equal to the air volume (B) in the measurement value DB 102 (see "(A)=(B)" route in FIG. 15A), the processing proceeds to step S262 in FIG. 15A. That is, the control determination unit 111 registers an "OK" determination in the determination result of the measurement value DB 102, in the storage unit 113 (step S262 in FIG. 15A). Then, the air volume comparison processing is ended.

Meanwhile, when the air volume (A) in the calibration value DB 101 is less than the air volume (B) in the measurement value DB 102 (see "(A)<(B)" route in FIG. 15A), the processing proceeds to step S263 in FIG. 15A. That is, the control determination unit 111 registers an "NG" determination in the determination result of the measurement value DB 102 in the storage unit 113 (step S263 in FIG. 15A). Then, the air volume comparison processing is ended.

Figure 15B:
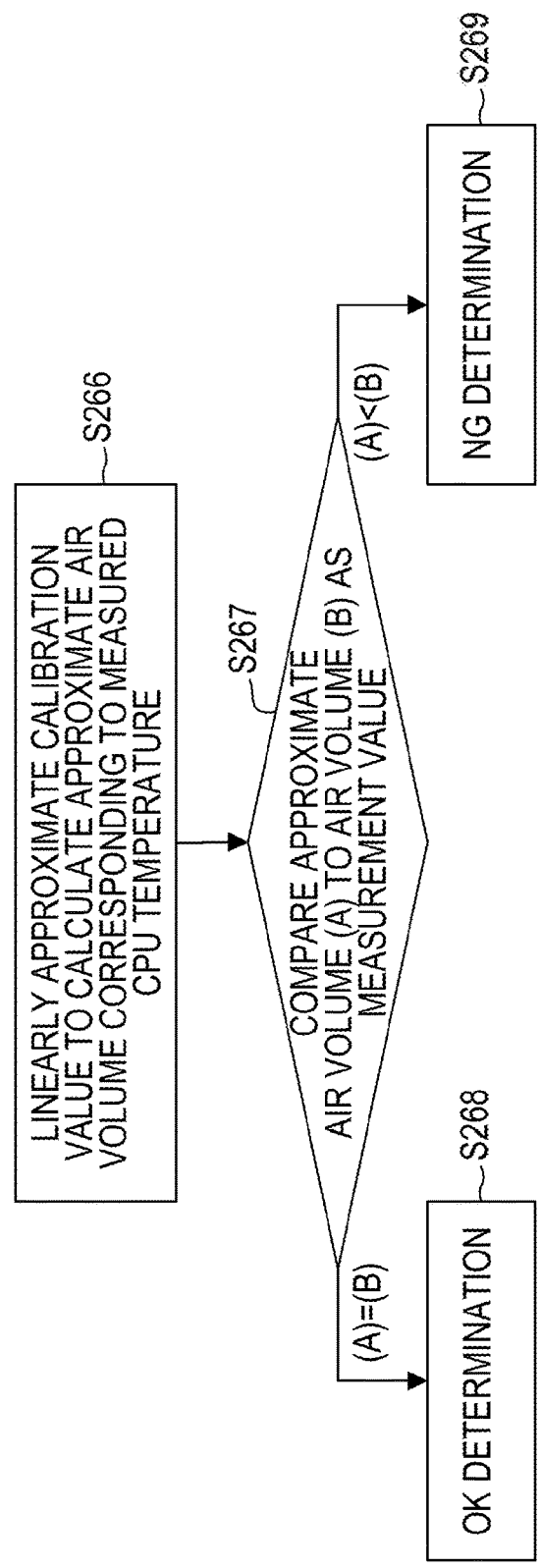

As illustrated in FIG. 15B, the control determination unit 111 linearly approximates each calibration value in the calibration value DB 101, and calculates an approximate air volume corresponding to the measured CPU temperature (step S266 in FIG. 15B).

The control determination unit 111 compares the approximate air volume (A) to the air volume (B) in the measurement value DB 102 (step S267 in FIG. 15B).

When the approximate air volume (A) is equal to the air volume (B) in the measurement value DB 102 (see "(A)=(B)" route in FIG. 15B), the processing proceeds to step S268 in FIG. 15B. That is, the control determination unit 111 registers an "OK" determination in the determination result of the measurement value DB 102, in the storage unit 113 (step S268 in FIG. 15B). Then, the air volume comparison processing is ended.

Meanwhile, when the approximate air volume (A) is less than the air volume (B) in the measurement value DB 102 (see "(A)<(B)" route in FIG. 15B), the processing proceeds to step S269 in FIG. 15B. That is, the control determination unit 111 registers an "NG" determination in the determination result of the measurement value DB 102, in the storage unit 113 (step S269 in FIG. 15B). Then, the air volume comparison processing is ended.

Figure 16:
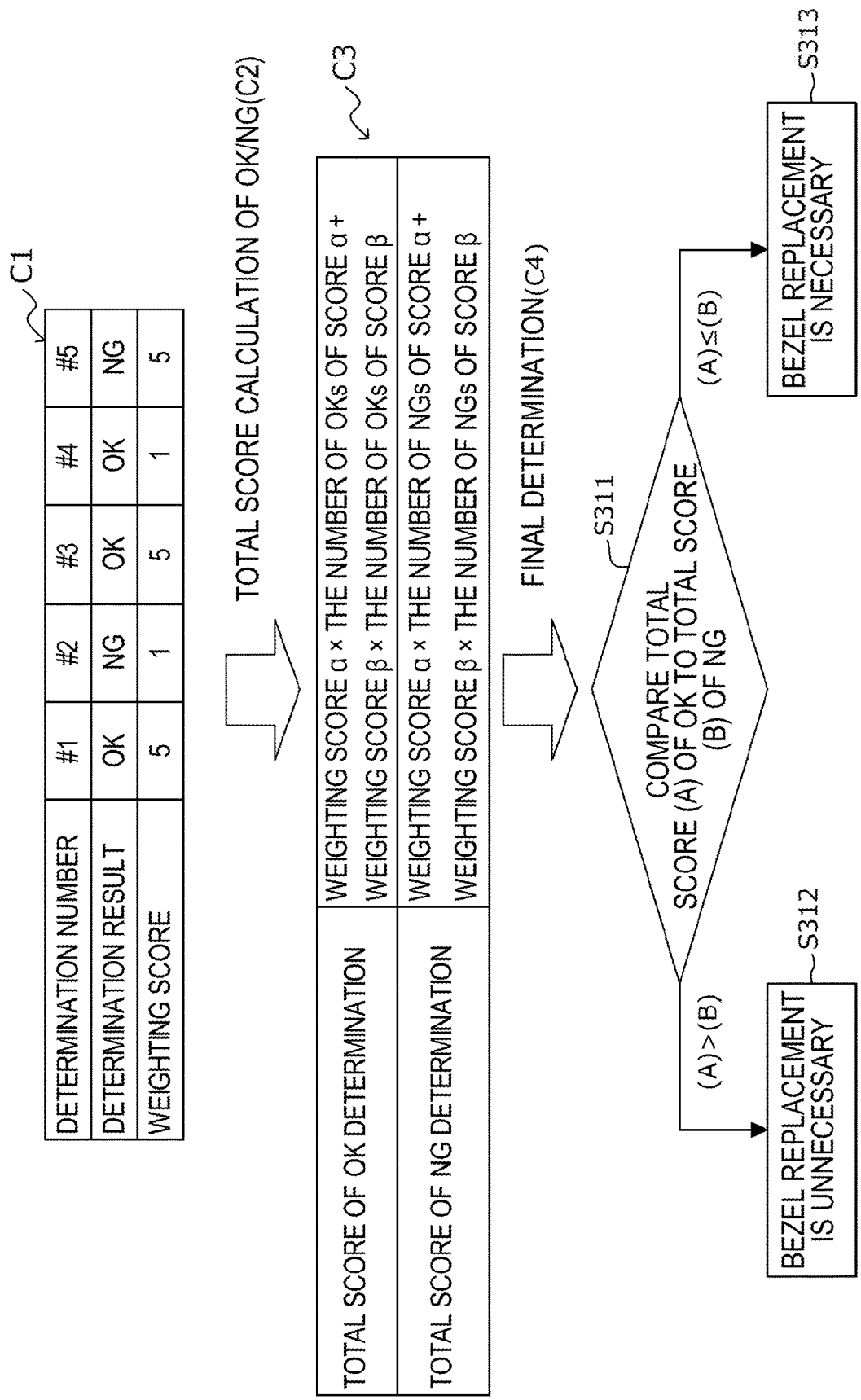
FIG. 16 is a flow chart illustrating details of a bezel replacement necessity determination illustrated in FIG. 9.

Next, details of the bezel replacement necessity determination illustrated in step S31 in FIG. 9 will be described in accordance with tables and a flow chart illustrated in FIG. 16 (reference numerals C1 to C4 and S311 to S313).

In the table indicated by the reference numeral C1, a determination number, a determination result, and a weighting score are associated with each other. For example, for the determination number "#1," the determination result is "OK" and the weighting score is "5," and for the determination number "#2," the determination result is "NG" and the weighting score is "1." As illustrated in the user setting parameter DB 104 in FIG. 10, the weighting score "5" may be the weighting of an actual measurement value, and the weighting score "1" may be the weighting of an approximate value.

As indicated by the reference numeral C2, the control determination unit 111 calculates total scores of OK determination and NG determination on the basis of the association between the determination result and the weighting score.

As indicated by the reference numeral C3, the total scores of the OK determination and the NG determination may be obtained by, for example, the following equations.

$$\text{Total score of OK determination} = \text{weighting score } \alpha \times \text{the number of OKs of score } \alpha + \text{weighting score } \beta \times \text{the number of OKs of score } \beta$$

$$\text{Total score of NG determination} = \text{weighting score } \alpha \times \text{the number of NGs of score } \alpha + \text{weighting score } \beta \times \text{the number of NGs of score } \beta$$

For example, the weighting score $\alpha$ may be the weighting of an actual measurement value, and the weighting score $\beta$ may be the weighting of an approximate value. When there are three or more weighting scores, in the total score of the OK determination, a product of a third or subsequent weighting score and the number of OKs of the corresponding score may be further added. When there are three or more weighting scores, in the total score of the NG determination as well, a product of a third or subsequent weighting score and the number of NGs of the corresponding score may be further added.

When the table indicated by the reference numeral C1 is applied to the numerical formula indicated by the reference numeral C3, the total scores of the OK determination and the NG determination are calculated as in the following equations.

$$\text{Total score of OK determination} = 5 \times 2 + 1 \times 1 = 11$$

$$\text{Total score of NG determination} = 5 \times 1 + 1 \times 1 = 6$$

Then, as indicated by the reference numeral C4, the control determination unit 111 performs a final determination on the basis of the calculated total scores of the OK determination and the NG determination.

That is, the control determination unit 111 compares a total score (A) of the OK determination to a total score (B) of the NG determination (step S311).

When the total score (A) of the OK determination is larger than the total score (B) of the NG determination (see "(A)>(B)" route in step S311), the control determination unit 111 determines that it is unnecessary to replace the dust-proof bezel 16 (step S312). Then, the bezel replacement necessity determination is ended.

Meanwhile, when the total score (A) of the OK determination is equal to or less than the total score (B) of the NG determination (see "(A)≤(B)" route in step S311), the control determination unit 111 determines that it is necessary to replace the dust-proof bezel 16 (step S313). Then, the bezel replacement necessity determination is ended.

[A-3] Effect

According to the monitoring target server 1 in an example of the first embodiment as described above, for example, the following operation effects may be achieved.

The storage unit 113 stores a predicted relationship between the temperature of the CPU 12 and an air volume of an air flow generated by the cooling fans 14, as the calibration value DB 101. The measurement unit 112 measures a relationship between the temperature of the CPU 12 and an air volume of an air flow which passes through the dust-proof bezel 16, as the measurement value DB 102. The control determination unit 111 determines an abnormality in the dust-proof bezel 16 by comparing the calibration value DB 101 to the measurement value DB 102.

Accordingly, it is possible to accurately determine the abnormality in the dust-proof bezel 16. Specifically, even when the temperature of the CPU 12 of the monitoring target server 1 is not kept constant (i.e., regardless of the state of the monitoring target server 1), it is possible to detect clogging due to deposition of dust or dirt in the dust-proof bezel 16.

The control determination unit 111 calculates an approximate value of the air volume in the calibration value DB 101 when the temperature of the CPU 12 in the measurement value DB 102 does not match the temperature of the CPU 12 in the calibration value DB 101. Then, the control determination unit 111 determines the abnormality in the dust-proof bezel 16 by comparing the calculated corresponding approximate value to the measured air volume.

Accordingly, even when the measured CPU temperature is not registered in the calibration value DB 101, it is possible to determine whether the measured air volume is proper.

The storage unit 113 additionally stores a relationship between the temperature of the CPU 12 in the measurement value DB 102 and the approximate value calculated by the control determination unit 111, in the calibration value DB 101.

Accordingly, it is possible to omit calculation of the approximate value of the air volume corresponding to the corresponding CPU temperature in the next measurement, and thus it is possible to improve the speed of the clogging detection processing of the dust-proof bezel 16.

The control determination unit 111 determines that the dust-proof bezel 16 is abnormal when the number of times where the calibration value DB 101 and the measurement value DB 102 match each other is equal to or less than the number of times where the calibration value DB 101 and the measurement value DB 102 do not match each other.

Accordingly, since the occurrence of clogging in the dust-proof bezel 16 is detected by comparing the air volumes to each other a plurality of times, it is possible to improve the detection accuracy.

The storage unit 113 stores the weighting of an actual measurement value for a case where the temperature of the CPU 12 in the measurement value DB 102 matches the temperature of the CPU 12 in the calibration value DB 101. The storage unit 113 stores the weighting of an approximate value for a case where the temperature of the CPU 12 in the measurement value DB 102 does not match the temperature of the CPU 12 in the calibration value DB 101. The control determination unit 111 determines that the dust-proof bezel 16 is abnormal when a value obtained by multiplying the number of times where the calibration value DB 101 and the measurement value DB 102 match each other by the weighting of the actual measurement value or the weighting of the approximate value, is equal to or less than a value obtained by multiplying the number of times where the calibration value DB 101 and the measurement value DB 102 do not match each other by the weighting of the actual measurement value or the weighting of the approximate value.

Accordingly, by applying different weighting values, to the determination result on the state of the dust-proof bezel 16 based on the actually measured value of the air volume and the determination result on the state of the dust-proof bezel 16 based on the approximate value of the air volume, respectively, it is possible to comprehensively determine the replacement necessity of the dust-proof bezel 16. Accordingly, it is possible to improve the detection accuracy of the occurrence of clogging in the dust-proof bezel 16.

[B] Example of Second Embodiment

[B-1] System Configuration Example

In some cases, it is determined that dirt is not detected by a comprehensive determination through one cycle of scoring, and scoring of dirt detection and scoring of dirt non-detection are close to each other (i.e., a timing when a determination of dirt detection will be made soon). In an example of the above-described first embodiment, in such a case, even when there is a timing when determination of dirt detection may be made halfway, measurement processings have to be performed a predetermined number of times for one cycle, in the next cycle. Thus, there is a possibility that determination of dirt detection may not be timely made.

In an example of the above-described first embodiment, it is assumed that after a calibration processing is performed when the monitoring target server 1 is powered ON, the surrounding environment of the corresponding monitoring target server 1 is not changed. Therefore, after the calibration processing, when the surrounding environment of the monitoring target server 1 is changed against the user's intention, the reference for measuring dirt also changes. Thus, there is a possibility that dirt may not be properly detected.

When the technology in an example of the above-described embodiment is applied to an environment in which a plurality of monitoring target servers 1 is provided such as a rack configuration, in some cases, a system FAN provided in a server room may be controlled or the monitoring target servers 1 in a rack may be inserted and removed. In such a case, since the surrounding environment of the monitoring target servers 1 is changed, there is a possibility that dirt may not be properly detected.

At the time of dirt measurement, when another maintenance operation is performed in parallel to the dirt measurement, and when the timing of replacement of the dust-proof bezel 16 is different from the timing of another maintenance operation, there is a possibility that an efficient operation may not be performed throughout the maintenance operation.

Figure 17:
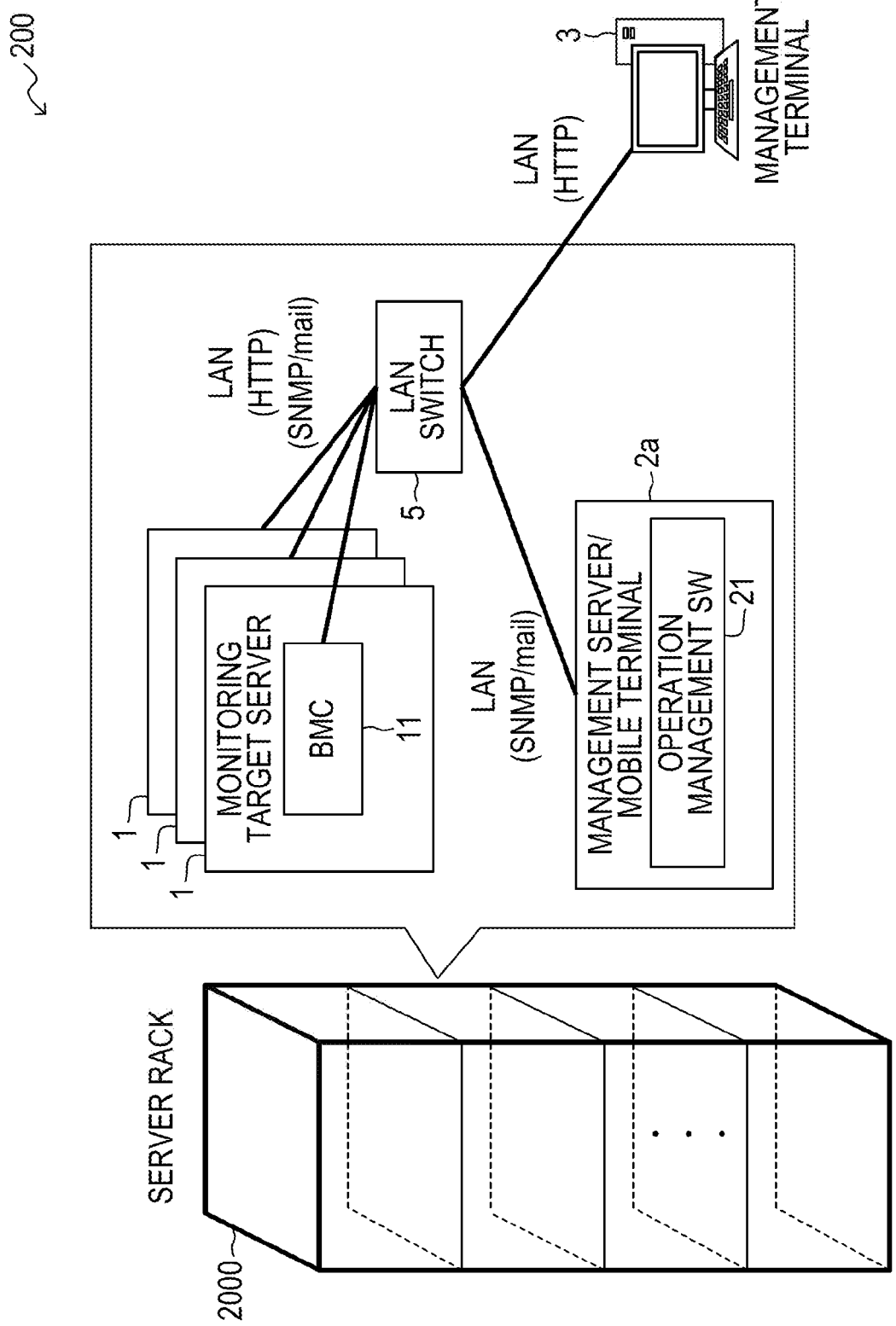
FIG. 17 is a block diagram schematically illustrating a configuration of an information processing system as an example of a second embodiment.

FIG. 17 is a block diagram schematically illustrating a configuration of an information processing system 200 as an example of a second embodiment.

In the information processing system 200, a plurality of monitoring target servers 1, each of which has the same configuration as that in an example of the above described first embodiment, is mounted in a server rack 2000. The BMC 11 of the monitoring target server 1 monitors an air volume by the air volume sensor 15 (described above with reference to FIG. 2) provided near the dust-proof bezel 16 (described above with reference to FIG. 2) of the monitoring target server 1, and a CPU temperature by a temperature sensor (not illustrated).

The BMC 11 functions as, for example, the control determination unit 111, the measurement unit 112, the storage unit 113, the notification unit 114, and the I/F processor 115, as described above with reference to FIG. 3.

In an example of the second embodiment, the control determination unit 111 determines that the dust-proof bezel 16 is abnormal when a value obtained by multiplying the number of times of matching by comparisons by a first or second weighting value is equal to or less than a value obtained by multiplying the number of times of non-matching by comparisons by a first or second weighting value and a third weighting value. The first weighting value may be the weighting of an actual measurement value, the second weighting value may be the weighting of an approximate value, and the third weighting value may be the weighting of a maintenance operation factor. Details of necessity determination of replacement of the dust-proof bezel 16 using the first to third weighting values will be described below with reference to FIG. 30, etc.

The control determination unit 111 determines that the dust-proof bezel 16 is abnormal when in the comparison recently performed a predetermined number of times, the number of times of matching by the comparisons is equal to or less than the number of times of non-matching by the comparisons.

The control determination unit 111 detects a change of the surrounding environment when a change ratio of a difference between an air volume stored in the calibration value DB 101 (described below with reference to FIGS. 19A to 19D, etc.) and an air volume measured by the measurement unit 112 exceeds an allowable range. Details of a detection processing of a change in the surrounding environment will be described below with reference to FIG. 29, etc.

The storage unit 113 stores the weighting (a third weighting value) of a maintenance operation factor for a case where a maintenance operation is performed on the monitoring target server 1, in a storage area. The storage unit 113 updates the calibration value DB 101 stored in the storage area when a change in the surrounding environment of the monitoring target server 1 is detected.

In the information processing system 200, for a management server/mobile terminal 2a, in addition to the configuration of the management server/mobile terminal 2 in an example of the above-described first embodiment, operation management software (SW) 21 is installed to monitor the monitoring target server 1. Hereinafter, the management server/mobile terminal 2a will be simply referred to as a management server 2a.

The monitoring target server 1 and the management server 2a may be connected to the management terminal 3 via a LAN switch 5.

Figure 18:
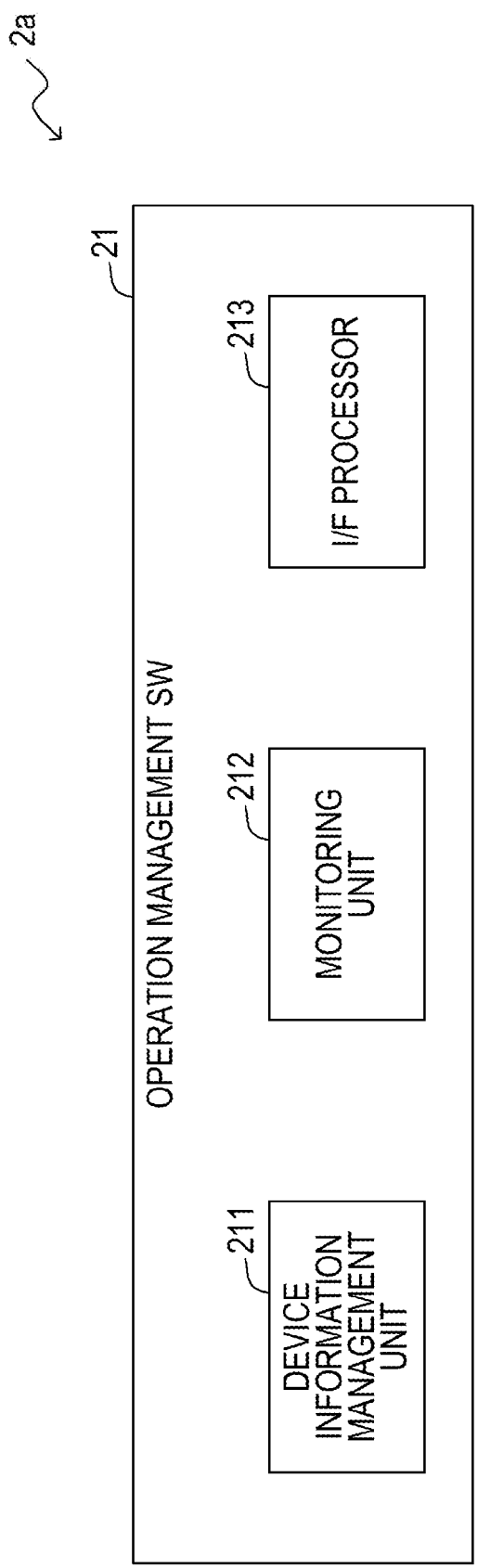
FIG. 18 is a view schematically illustrating a functional configuration of a management server illustrated in FIG. 17.

FIG. 18 is a view schematically illustrating a functional configuration of the management server 2a illustrated in FIG. 17.

An operation management SW 21 is downloaded to the management server 2a. The operation management SW 21 functions as a device information management unit 211, a monitoring unit 212, and an I/F processor 213.

The device information management unit 211 registers and manages management target device information (e.g., a model name, a serial number, or an Internet Protocol (IP) address) in the monitoring target server 1, etc.

The monitoring unit 212 monitors various events. The various events are, for example, SNMP traps notified from each device, notification of a status change of each device, and checking of an intake air temperature, a CPU usage rate, a power consumption, etc. which are acquired from each device.

The I/F processor 213 communicates with the monitoring target server 1 or the management terminal 3 by using a LAN.

FIG. 19A is a table indicating the calibration value DB 101.

The calibration value DB 101 is an example of comparison information in which the temperature of the CPU 12 and an air volume of an air flow generated by the cooling fans 14 are registered in association with each other. In the calibration value DB 101, as in an example of the above-described first embodiment, a calibration number, a CPU temperature $D1(a)$, an air volume $D2(a)$, and an approximation processing flag $D3(a)$ are registered. As illustrated, all values in the calibration value DB 101 may be "0" at the initial state.

FIG. 19B is a table indicating a measurement value DB 102a.

The measurement value DB 102a holds a relationship between the temperature of the CPU 12 and an air volume of an air flow which passes through the dust-proof bezel 16. In the measurement value DB 102a, in addition to a measurement number, a CPU temperature $D1(b)$, an air volume $D2(b)$, and a determination result $D4(b)$ in the measurement value DB 102 in an example of the above-described first embodiment, a maintenance operation factor $D3(b)$ is registered. As illustrated, all values in the measurement value DB 102a may be "0" at the initial state.

The maintenance operation factor $D3(b)$ is set to "1" when an event requiring a maintenance operation, such as hardware failure of the monitoring target server 1, has occurred.

FIG. 19C is a table indicating the calibration parameter DB 103.

The calibration parameter DB 103 maintains a CPU temperature $D1(c)$ which is additionally registered in the calibration value DB 101 as in an example of the above-described first embodiment. As illustrated, all values in the calibration parameter DB 103 may be "0" at the initial state.

FIG. 19D is a table indicating a user setting parameter DB 104a.

The user setting parameter DB 104a holds various values set by the user. In the user setting parameter DB 104a, a temperature interval value $D1(d)$, the weighting of an actual measurement value D2(d), the weighting of an approximate value D3(d), and an interval time D5(d) are registered as in the user setting parameter DB 104 in an example of the above-described first embodiment. In the user setting parameter DB 104a, in addition to the values of the user setting parameter DB 104 in an example of the above-described first embodiment, the weighting of a maintenance operation factor D4(d), a difference allowable range D6(d), and an allowable range D7(d) of the difference change ratio are registered. As illustrated, all values in the user setting parameter DB 104a may be "0" at the initial state.

The weight of the maintenance operation factor D4(d) is an example of a third weighting value, and is a value used when an event requiring a maintenance operation occurs, and a value of the maintenance operation factor D3(b) in the measurement value DB 102a is set to "1."

The difference allowable range D6(d) indicates an allowable range of a difference between the air volume D2(a) in the calibration value DB 101 and the air volume D2(b) in the measurement value DB 102a.

The allowable range D7(d) of the difference change ratio indicates an allowable range of a change ratio of the difference between the air volume D2(a) in the calibration value DB 101 and the air volume D2(b) in the measurement value DB 102a, between a previous measurement time and a current measurement time.

FIG. 20 is a table indicating a difference DB 105 in the monitoring target server 1 illustrated in FIG. 17.

The difference DB 105 indicates a difference between a calibration value and a measurement value. In the difference DB 105, a measurement number, a CPU temperature D1(e), a difference D2(e), and a difference change ratio D3(e) are registered. As illustrated, all values in the difference DB 105 may be "0" at the initial state.

The measurement number is a number that identifies each combination of a calibration value and a measurement value. In the measurement number, values of #1 to #M (M is a natural number of 2 or more) may be registered.

In the CPU temperature D1(e), the temperature of the CPU 12 registered in the measurement value DB 102a is registered, and the unit may be, for example, ° C.

In the difference D2(e), a ratio of a difference between the air volume D2(a) of the calibration value DB 101 and the air volume D2(b) of the measurement value DB 102a is registered, and the unit may be, for example, %.

In the difference change ratio D3(e), a change ratio of the difference between the air volume D2(a) of the calibration value DB 101 and the air volume D2(b) of the measurement value DB 102a, from a previous measurement time, is registered, and the unit may be, for example, %.

[B-2] Operation Example

Figure 21:
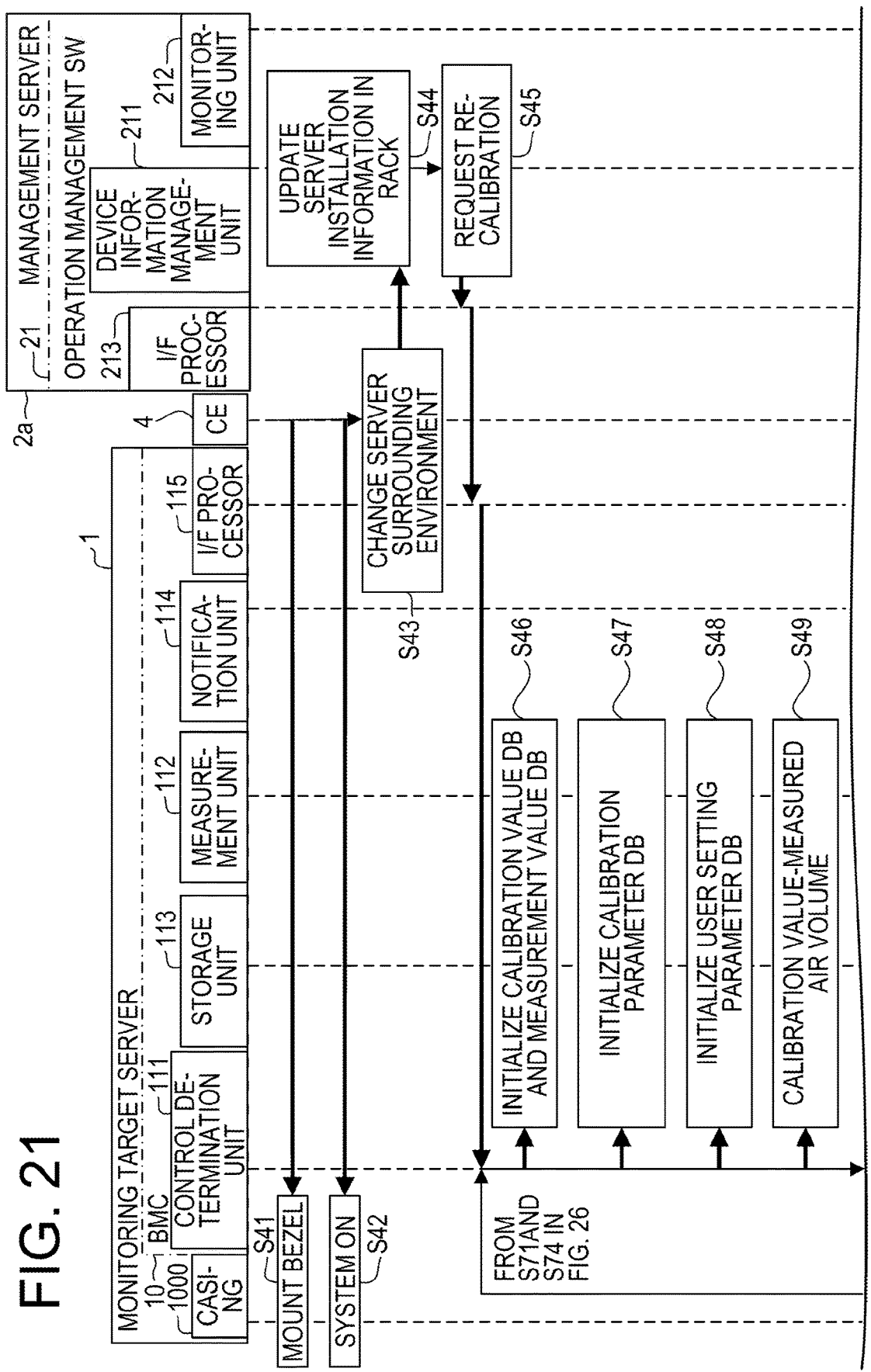
FIG. 21 is a sequence diagram illustrating a clogging detection processing of a dust-proof bezel in the monitoring target server illustrated in FIG. 17.
Figure 22:
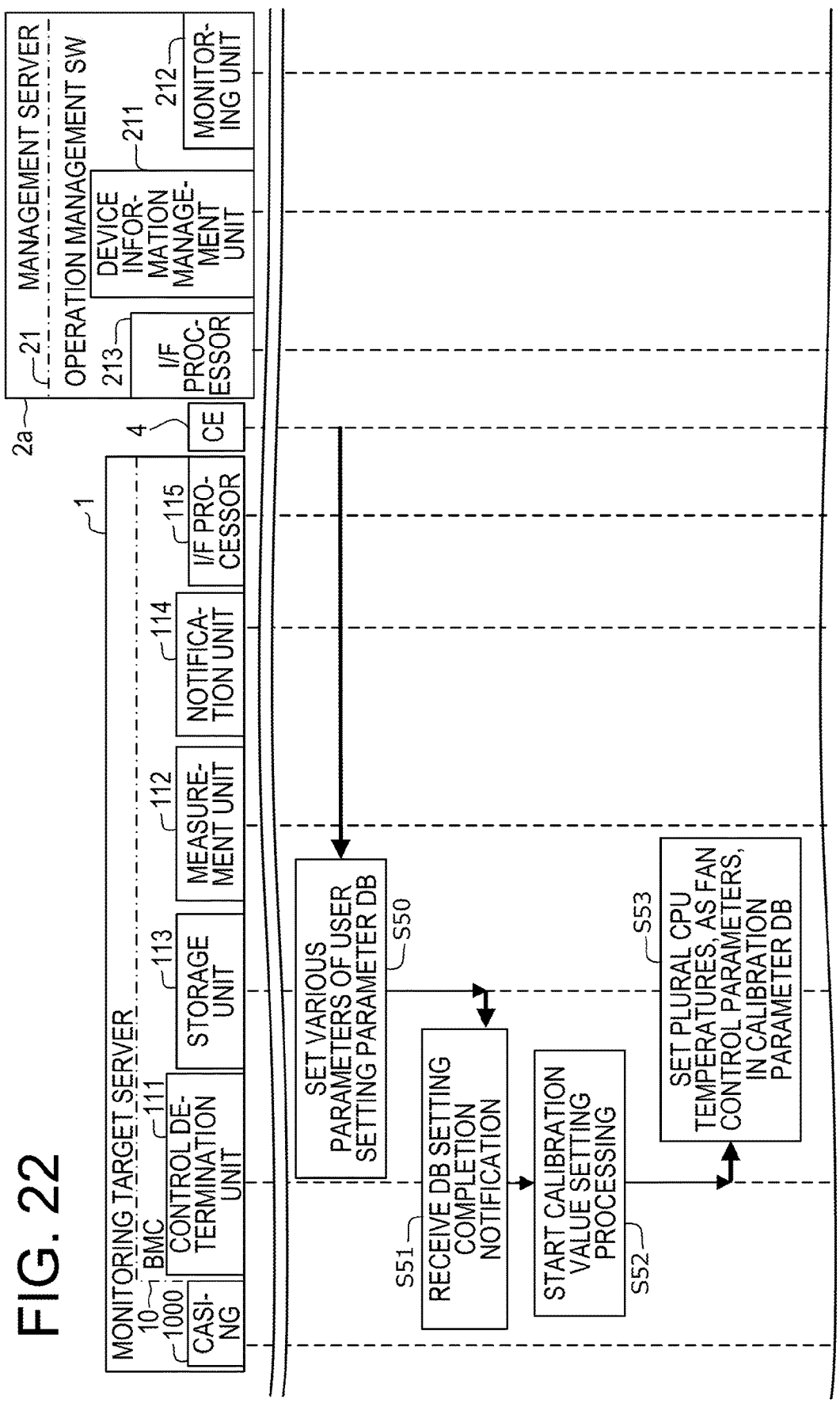
FIG. 22 is a sequence diagram illustrating the clogging detection processing of the dust-proof bezel in the monitoring target server illustrated in FIG. 17.
Figure 23:
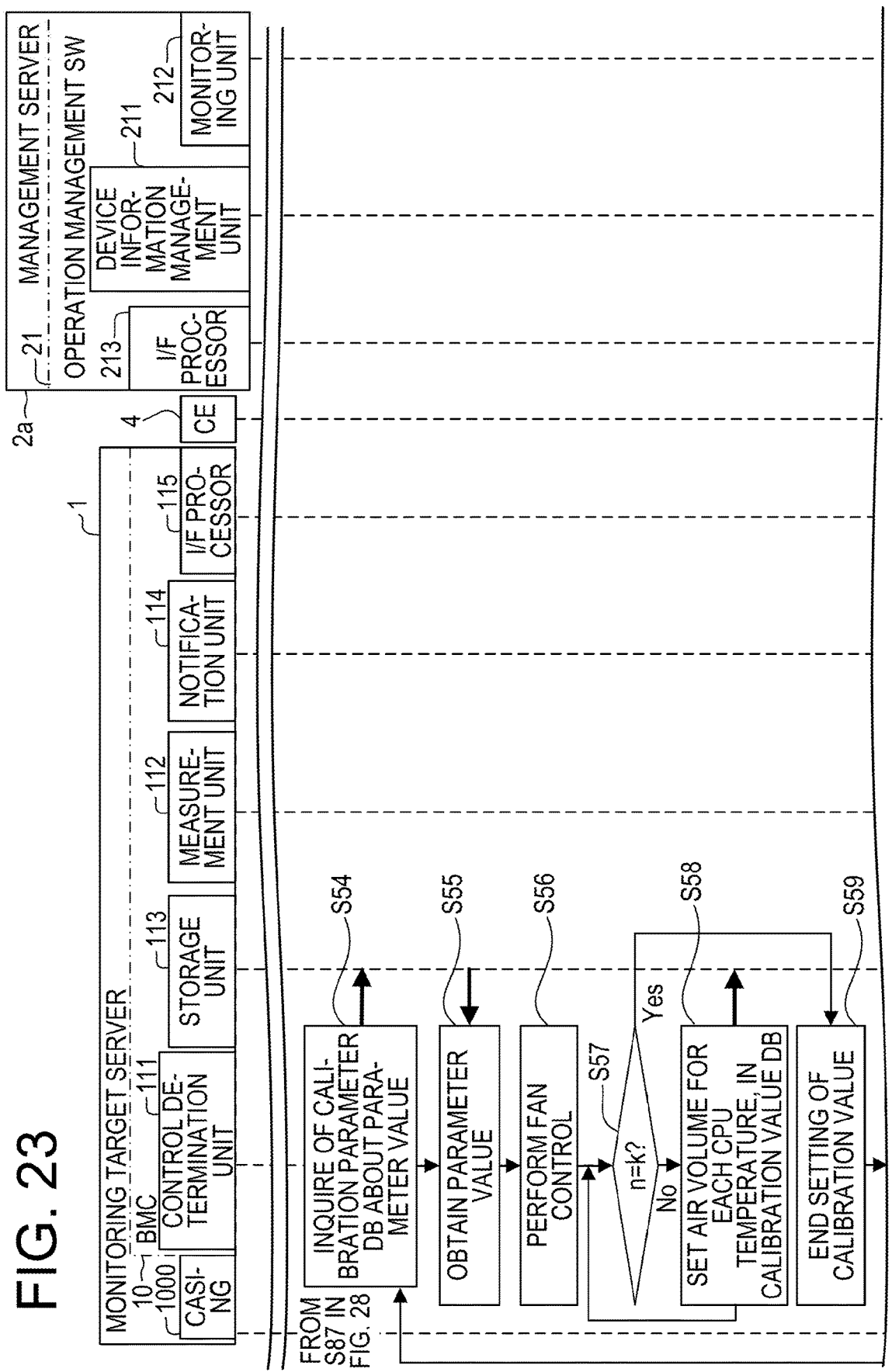
FIG. 23 is a sequence diagram illustrating the clogging detection processing of the dust-proof bezel in the monitoring target server illustrated in FIG. 17.
Figure 24:
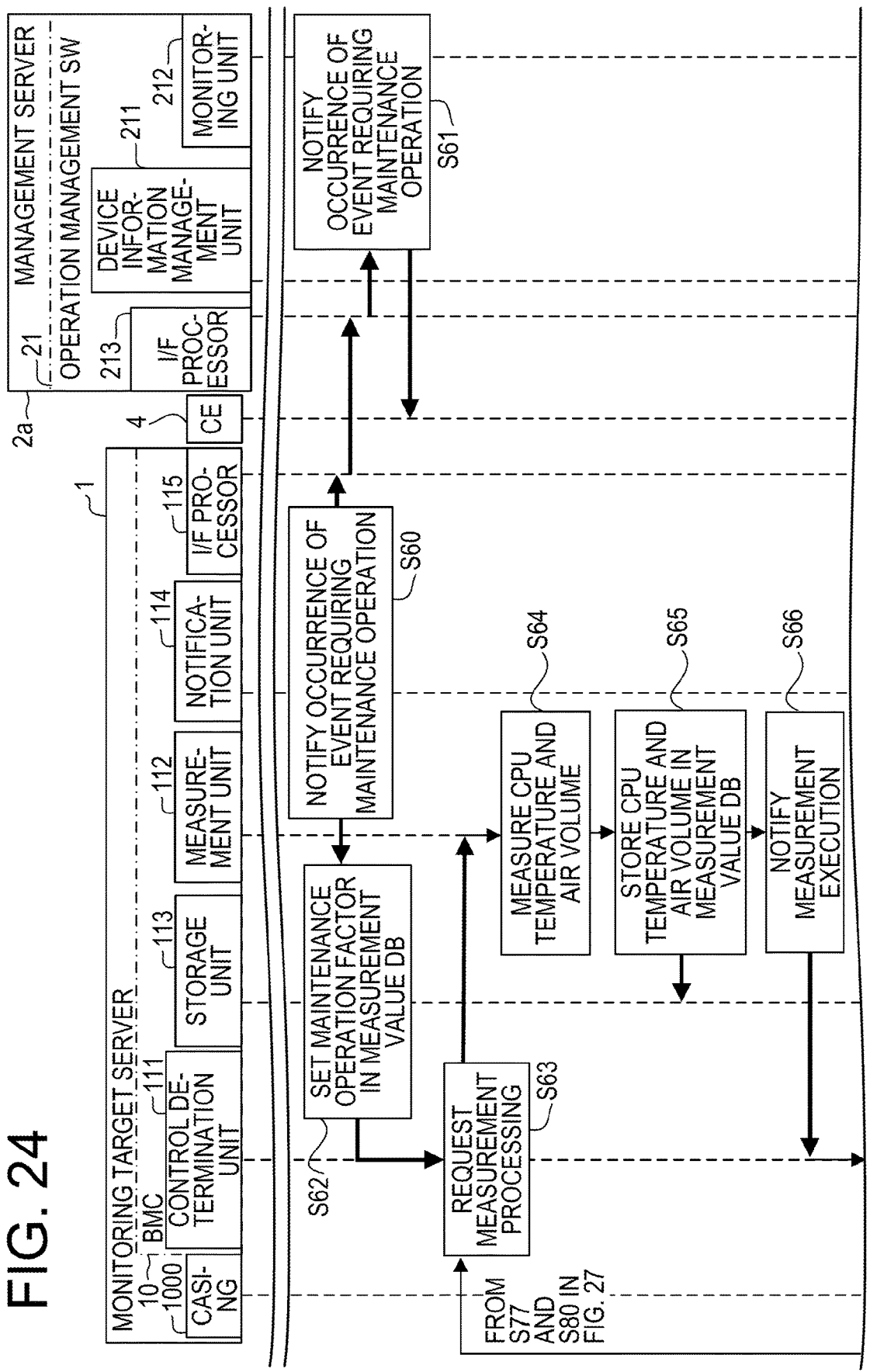
FIG. 24 is a sequence diagram illustrating the clogging detection processing of the dust-proof bezel in the monitoring target server illustrated in FIG. 17.
Figure 25:
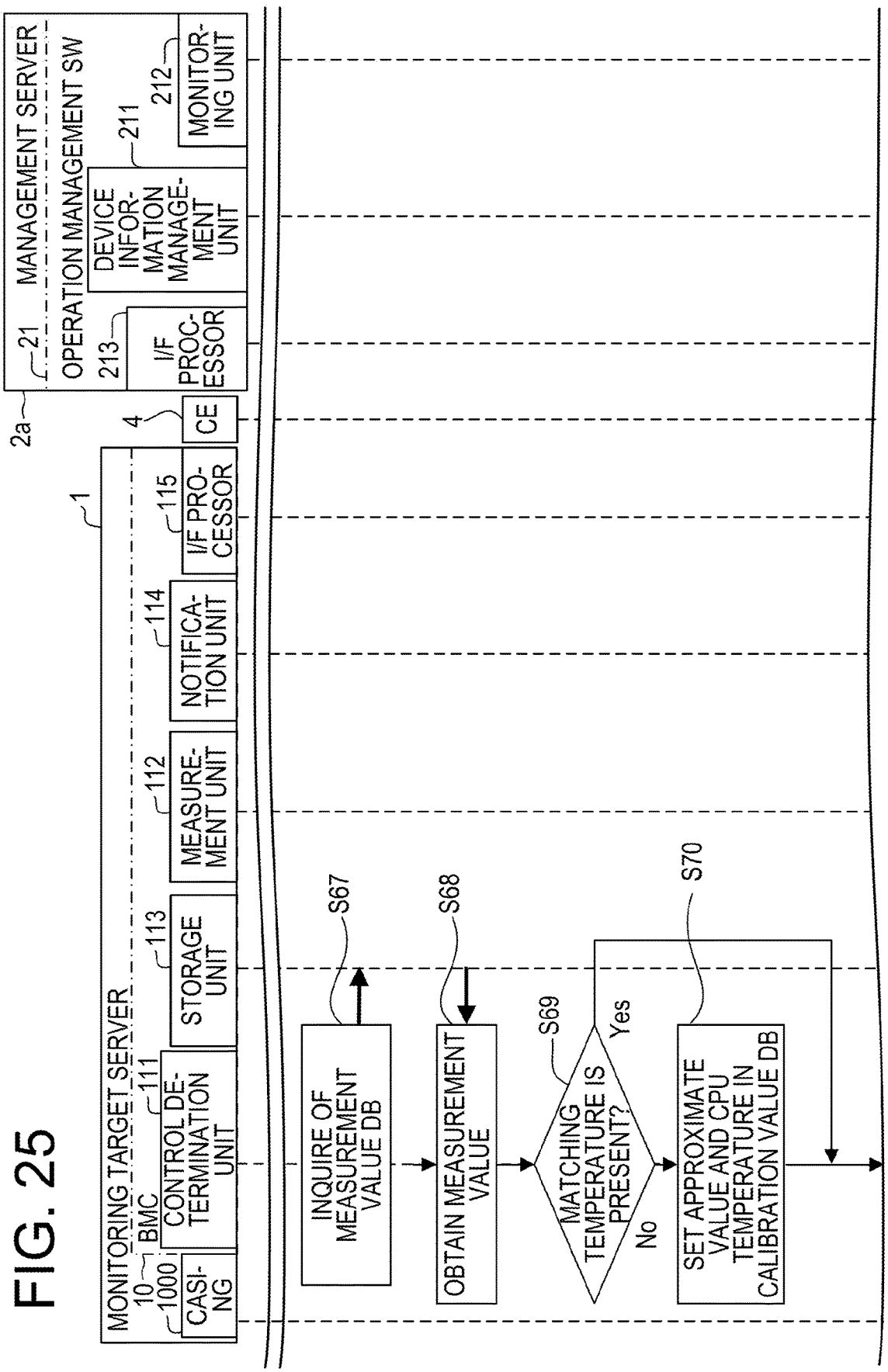
FIG. 25 is a sequence diagram illustrating the clogging detection processing of the dust-proof bezel in the monitoring target server illustrated in FIG. 17.
Figure 26:
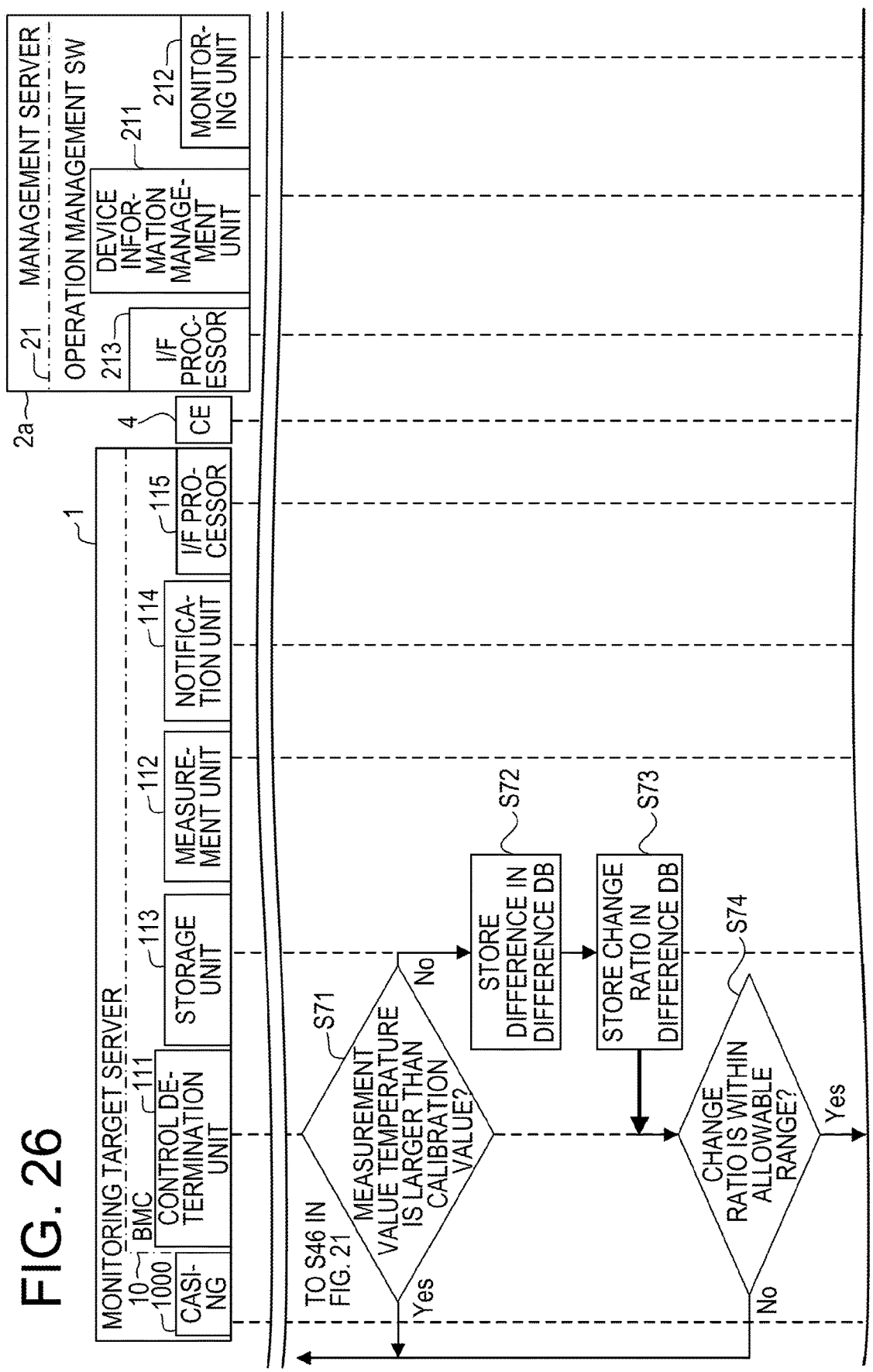
FIG. 26 is a sequence diagram illustrating the clogging detection processing of the dust-proof bezel in the monitoring target server illustrated in FIG. 17.
Figure 27:
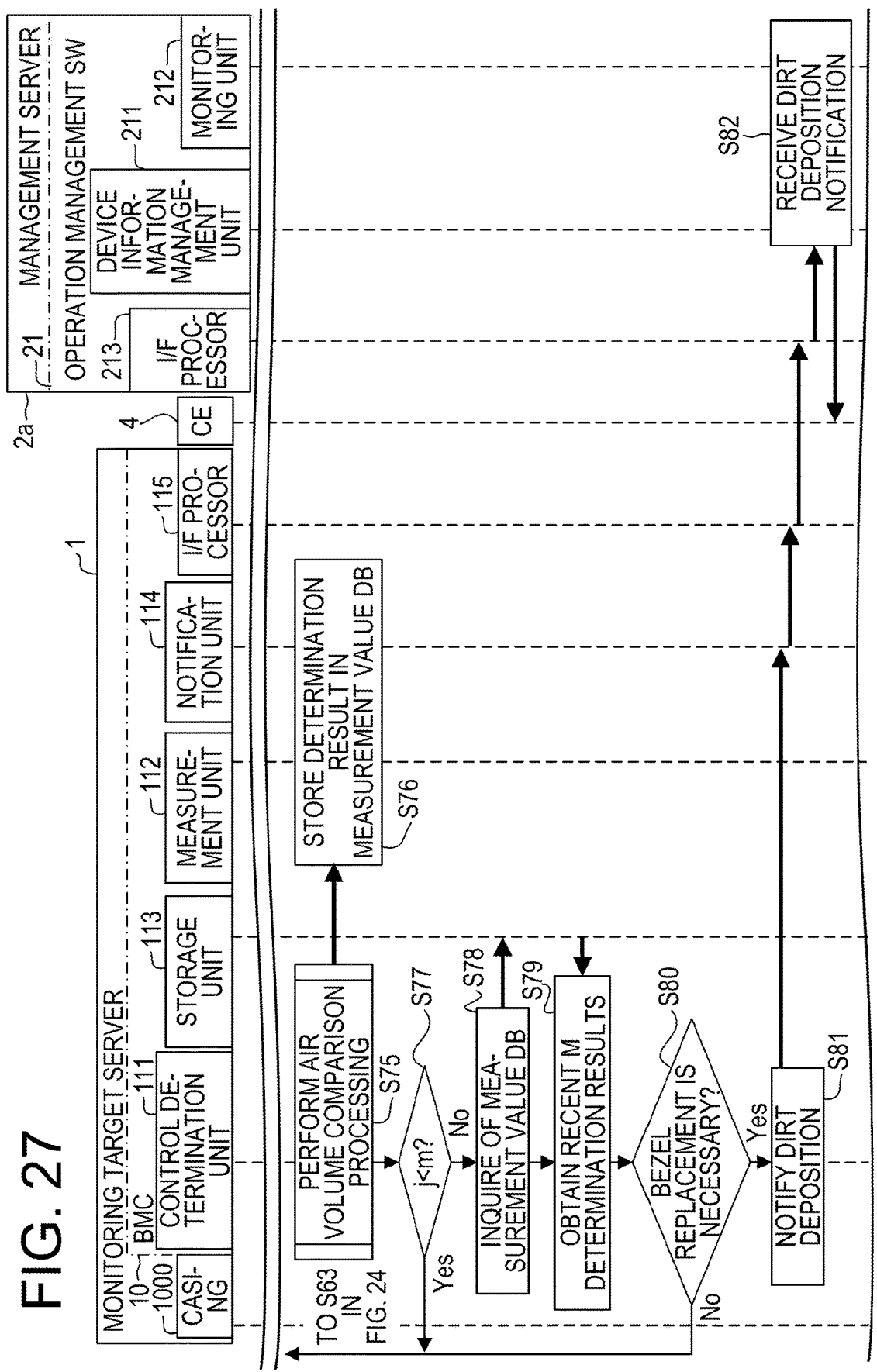
FIG. 27 is a sequence diagram illustrating the clogging detection processing of the dust-proof bezel in the monitoring target server illustrated in FIG. 17.
Figure 28:
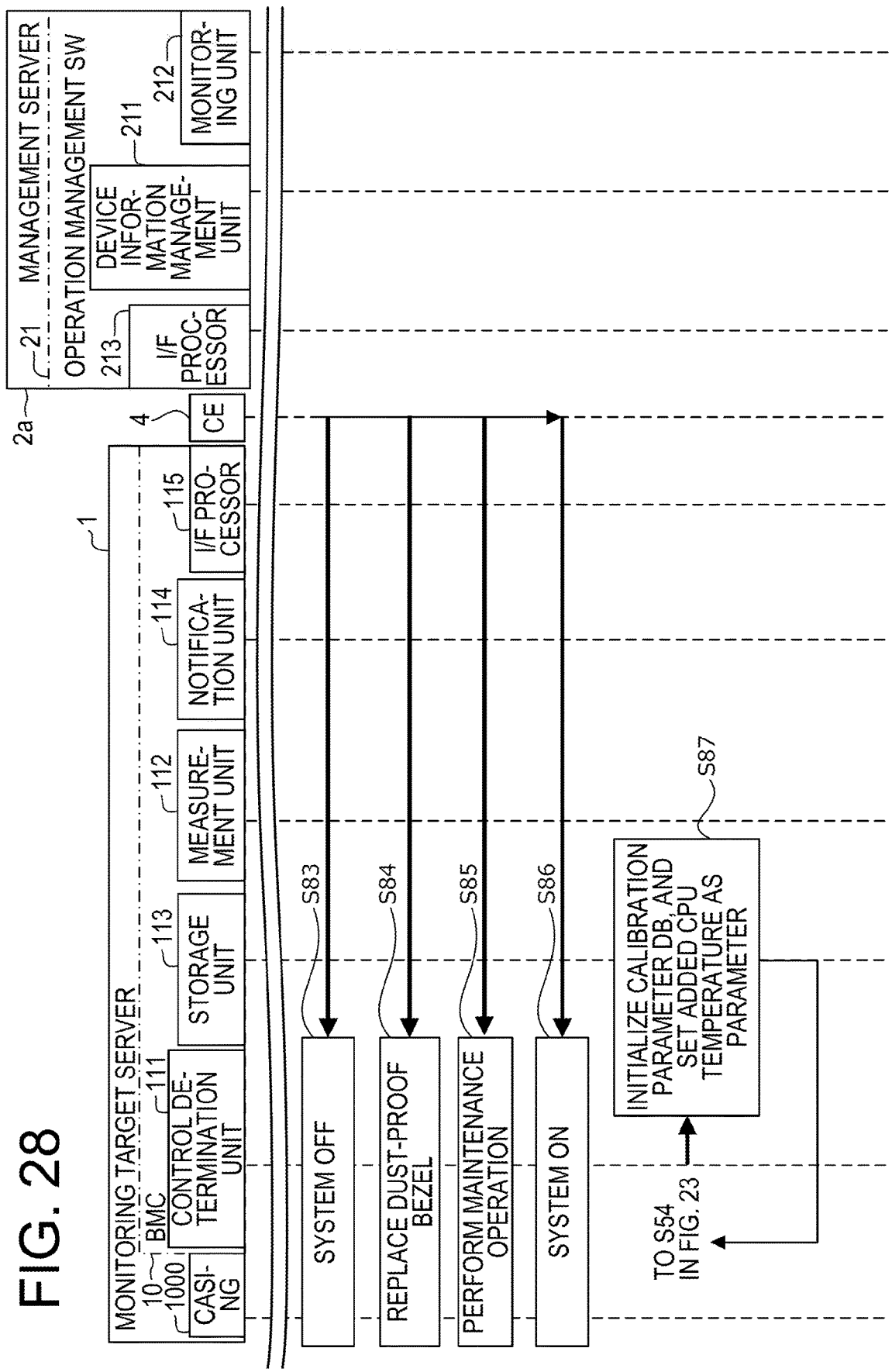
FIG. 28 is a sequence diagram illustrating the clogging detection processing of the dust-proof bezel in the monitoring target server illustrated in FIG. 17.

Descriptions will be made on a clogging detection processing of the dust-proof bezel 16 (see FIG. 2) in the monitoring target server 1 in an example of the second embodiment as described above, in accordance with the sequence diagrams illustrated in FIGS. 21 to 28 (steps S41 to S87). FIG. 21 illustrates a processing in steps S41 to S49, FIG. 22 illustrates a processing in steps S50 to S53, FIG. 23 illustrates a processing in steps S54 to S59, and FIG. 24 illustrates a processing in steps S60 to S66. FIG. 25 illustrates a processing in steps S67 to S70, FIG. 26 illustrates a processing in steps S71 to S74, FIG. 27 illustrates a processing in steps S75 to S82, and FIG. 28 illustrates a processing in steps S83 to S87.

As illustrated in FIG. 21, the CE 4 mounts the dust-proof bezel 16 on the casing 1000 of the monitoring target server 1 (step S41 in FIG. 21).

The CE 4 powers ON the system, in the casing 1000 of the monitoring target server 1 (step S42 in FIG. 21).

Here, the CE 4 changes the surrounding environment of the monitoring target server 1 (step S43 in FIG. 21).

Accordingly, the device information management unit 211 in the operation management SW 21 of the management server 2a updates server installation information within the server rack 2000 (step S44 in FIG. 21).

The device information management unit 211 requests the monitoring target server 1 to perform a re-calibration (step S45 in FIG. 21). The request of re-calibration is issued to the control determination unit 111 of the BMC 11 via the I/F processor 213 in the operation management SW 21 of the management server 2a, and the I/F processor 115 in the BMC 11 of the monitoring target server 1.

As illustrated in each of FIGS. 19A and 19B, the control determination unit 111 initializes the calibration value DB 101 and the measurement value DB 102a in the storage unit 113 (step S46 in FIG. 21).

For example, in the measurement value DB 102a, a setting may be made in such a manner that 12 measurement processings a day are possible.

As illustrated in FIG. 19C, the control determination unit 111 initializes the calibration parameter DB 103 in the storage unit 113 (step S47 in FIG. 21).

For example, in the calibration parameter DB 103, the CPU temperatures D1(c) of each monitoring target server 1 based on the temperature interval value D1(d) of the calibration may be set to, for example, 40.0° C., 40.5° C., . . . , 89.5° C., 90.0° C. via an IPMB interface function. The temperature interval width D1(d) may be set to an arbitrary value in measurable units of the BMC 11, and upper/lower limit values (e.g., room temperature to 90.0° C.) of the temperature may be uniquely determined in accordance with the specification of the mounted CPU 12 (described above with reference to FIG. 2).

As illustrated in FIG. 19D, the control determination unit 111 initializes the user setting parameter DB 104a in the storage unit 113 (step S48 in FIG. 21).

For example, in the user setting parameter DB 104a, the temperature interval value D1(d) may be set to "0.5," the weighting of the actual measurement value D2(d) may be set to "5," the weighting of the approximate value D3(d) may set to "1," the weighting of the maintenance operation factor D4(d) may be set to "4," and the interval time may be set to "two hours."

The control determination unit 111 calculates a difference between the air volume D2(a) in the calibration value DB 101 and the air volume D2(b) in the measurement value DB 102a, and stores the difference in the storage unit 113 (step S49 in FIG. 21).

As illustrated in FIG. 22, the storage unit 113 accepts settings of various parameters in the user setting parameter DB 104a, on the basis of the input from the CE 4 (step S50 in FIG. 22).

The control determination unit 111 receives a DB setting completion notification from the storage unit 113 (step S51 in FIG. 22).

The control determination unit 111 starts a calibration value setting processing (step S52 in FIG. 22).

The control determination unit 111 sets a plurality of CPU temperatures D1(c) as parameters for FAN control, in the calibration parameter DB 103, in the storage unit 113 (step S53 in FIG. 22).

As illustrated in FIG. 23, the control determination unit 111 inquires of the calibration parameter DB 103 in the storage unit 113 about a parameter value for each CPU temperature D1(c) (step S54 in FIG. 23).

The control determination unit 111 obtains the parameter value from the calibration parameter DB 103 in the storage unit 113 (step S55 in FIG. 23).

The control determination unit 111 performs a control of the cooling fans 14 (FAN control) (step S56 in FIG. 23).

The control determination unit 111 determines whether a variable k (k is a natural number of 0 or more and n or less) has reached the number n of parameter values registered in the calibration parameter DB 103 (step S57 in FIG. 23).

When it is determined that the variable k has not reached the number n of calibration values (see "No" route in step S57 in FIG. 23), the air volume D2(a) measured for each CPU temperature D1(a) is set in the calibration value DB 101 (step S58 in FIG. 23). Then, the control determination unit 111 increments the variable "k,", by "1," and the processing returns to step S57 in FIG. 23.

On the basis of the CPU temperatures (e.g., 40.0° C., 40.5° C., ..., 89.5° C., 90.0° C.) in the calibration parameter DB 103, a calibration at each CPU temperature D1(a) is performed via an IPBM interface of the BMC 11. Then, the air volume D2(a) at each CPU temperature D1(a) (e.g., at the CPU temperature of 60.0° C., an air volume value of 0.11 (m$^3$/min)) is set in the calibration value DB 101.

Meanwhile, when it is determined that the variable k has reached the number n of calibration values (see "Yes" route in step S57 in FIG. 23), the control determination unit 111 ends setting of the calibration values in the calibration value DB 101 (step S59 in FIG. 23).

Here, as illustrated in FIG. 24, the notification unit 114 of the BMC 11 notifies the management server 2a about an occurrence of an event that requires a maintenance operation (step S60 in FIG. 24). The notification to the management server 2a is performed for the monitoring unit 212 of the operation management SW 21 via the I/F processor 115 of the BMC 11 and the I/F processor 213 of the operation management SW 21.

The monitoring unit 212 of the operation management SW 21 notifies the CE 4 about the occurrence of the event that requires a maintenance operation (step S61 in FIG. 24).

Meanwhile, the storage unit 113 of the BMC 11 sets the maintenance operation factor D3(b) in the measurement value DB 102a on the basis of the notification by the notification unit 114 (step S62 in FIG. 24).

The control determination unit 111 requests the measurement unit 112 to perform a measurement processing of the CPU temperature D1(b) and the air volume D2(b) (step S63 in FIG. 24). The request of the measurement processing is performed on the basis of the interval time D5(d) in the user setting parameter DB 104a.

The measurement unit 112 measures a CPU temperature and an air volume (step S64 in FIG. 24). The measurement of the CPU temperature and the air volume may be executed by using the IPMB interface function.

The measurement unit 112 stores the CPU temperature D1(b) in the measurement value DB 102a (step S65 in FIG. 24).

The measurement unit 112 notifies the control determination unit 111 of the measurement execution (step S66 in FIG. 24).

As illustrated in FIG. 25, the control determination unit 111 inquires of the storage unit 113 about a measurement value in the measurement value DB 102a (step S67 in FIG. 25).

The control determination unit 111 obtains the measurement value from the storage unit 113 (step S68 in FIG. 25).

The control determination unit 111 determines whether a CPU temperature D1(a) which matches the CPU temperature D1(b) in the measurement value DB 102a exists in the calibration value DB 101 (step S69 in FIG. 25).

When it is determined that there is a matching CPU temperature (see "Yes" route in step S69 in FIG. 25), the processing proceeds to step S71 in FIG. 26.

Meanwhile, when it is determined that there is no matching CPU temperature (see "No" route in step S69 in FIG. 25), the control determination unit 111 sets an approximate value of the air volume and the CPU temperature in the calibration value DB 101 (step S70 in FIG. 25).

As illustrated in FIG. 26, the control determination unit 111 determines whether the air volume D2(b) in the measurement value DB 102a is larger than the air volume D2(a) in the calibration value DB 101 (step S71 in FIG. 26).

When it is determined that the air volume D2(b) as the measurement value is larger than the air volume D2(a) as the calibration value (see "Yes" route in step S71 in FIG. 26), the processing returns to step S46 in FIG. 21 and the re-calibration is performed.

For example, an examination is made on a case where the measured CPU temperature is 60.0° C., and the measured air volume D2(b) is 0.17 m$^3$/min, while the air volume D2(a) as the calibration value is 0.15 m$^3$/min. In this case, the air volume D2(b) and the air volume D2(a) are compared to each other through a BMC-CPU function. Then, since the air volume D2(b) is larger than the air volume D2(a), it is determined that the surrounding environment has changed. Then, the dirt detection processing of the monitoring target server 1 is ended, and the re-calibration is performed.

Meanwhile, when it is determined that the air volume D2(b) as the measurement value is equal to or less than the air volume D2(a) as the calibration value (see "No" route in step S71 in FIG. 26), the storage unit 113 stores the difference D2(e) between the air volume D2(b) as the measurement value and the air volume D2(a) as the calibration value, in the difference DB 105 (step S72 in FIG. 26).

For example, an examination is made on a case where the measured CPU temperature is 60.0° C. and the measured air volume D2(b) is 0.15 m$^3$/min, while the air volume D2(a) as the calibration value is 0.15 m$^3$/min. In this case, the air volume D2(b) and the air volume D2(a) are compared to each other through the BMC-CPU function. Then, since the air volume D2(b) is equal to the air volume D2(a), it is determined that the surrounding environment has not changed. Then, the dirt detection processing of the monitoring target server 1 is continued.

For example, an examination is made on a case where the measured CPU temperature is 60.0° C. and the measured air volume D2(b) is 0.13 m$^3$/min, while the air volume D2(a) as the calibration value is 0.15 m$^3$/min. In this case, the air volume D2(b) and the air volume D2(a) are compared to each other through the BMC-CPU function. Then, since the air volume D2(b) is smaller than the air volume D2(a), it is determined that the surrounding environment has not changed. Then, the dirt detection processing of the monitoring target server 1 is continued and the difference change ratio D3(e) (e.g., 10%) between the previous measurement time and the current measurement time, in a difference between the measurement value and the calibration value of the air volume, is stored in the difference DB 105.

When the monitoring target server 1 within the server rack 2000 is inserted or removed, as illustrated in steps S41 to S43 in FIG. 21, an event is received from the management server 2a. Then, the dirt detection processing of the monitoring target server 1 is ended, and the re-calibration is performed.

The storage unit 113 stores the difference change ratio D3(e) in the difference DB 105 (step S73 in FIG. 26).

The control determination unit 111 determines whether the difference change ratio D3(e) in the difference DB 105 is within the allowable range D7(d) of the difference change ratio in the user setting parameter DB 104a (step S74 in FIG. 26).

When it is determined that the difference change ratio D3(e) is not within the allowable range D7(d) of the difference change ratio (see "No" route in step S74 in FIG. 26), the processing returns to step S46 in FIG. 21 and the re-calibration is performed.

For example, an examination is made on a case where a difference between the measurement value of a previously measured air volume and the calibration value is 10%, a difference between the measurement value of a currently measured air volume and the calibration value is 20%, and the allowable range D7(d) of the difference change ratio is 5%. In this case, since the change ratio (20−10=10%) between the previous measurement time and the current measurement time in the difference exceeds the allowable range D7(d) of the difference change ratio, that is, 5%, the dirt detection processing of the monitoring target server 1 is ended, and the re-calibration is performed.

Meanwhile, when the difference change ratio D3(e) is within the allowable range D7(d) of the difference change ratio (see "Yes" route in step S74 in FIG. 26), the processing proceeds to step S75 in FIG. 27.

For example, an examination is made on a case where a difference between the measurement value of a previously measured air volume and the calibration value is 10%, a difference between the measurement value of a currently measured air volume and the calibration value is 20%, and the allowable range D7(d) of the difference change ratio is 20%. In this case, since the change ratio (20−10=10%) between the previous measurement time and the current measurement time in the difference is equal to or less than the allowable range D7(d) of the difference change ratio, that is, 20%, the dirt detection processing of the monitoring target server 1 is continued.

For example, an examination is made on a case where a difference between the measurement value of a previously measured air volume and the calibration value is 10%, a difference between the measurement value of a currently measured air volume and the calibration value is 20%, and the allowable range D7(d) of the difference change ratio is 10%. In this case, since the change ratio (20−10=10%) between the previous measurement time and the current measurement time in the difference is equal to or less than the allowable range D7(d) of the difference change ratio, that is, 10%, the dirt detection processing of the monitoring target server 1 is continued.

As illustrated in FIG. 27, the control determination unit 111 performs a comparison processing between the air volume in the calibration value DB 101 and the air volume in the measurement value DB 102 (step S75 in FIG. 27). Details of the air volume comparison processing will be described below with reference to FIG. 29.

The measurement unit 112 stores the determination result D4(b) in the measurement value DB 102a (step S76 in FIG. 27).

The control determination unit 111 determines whether the current number of times of measurement j is less than a predetermined number of times of measurement m (step S77 in FIG. 27).

When it is determined that the current number of times of measurement j is less than the predetermined number of times of measurement m (see "Yes" route in step S77 in FIG. 27), the processing returns to step S63 in FIG. 24, and measurement of a CPU temperature and an air volume is repeated. That is, the measurement processing and the air volume comparison processing are repeatedly performed as many as the predetermined number of times of measurement m (e.g., 12 times a day).

Meanwhile, when it is determined that the current number of times of measurement j is equal to or larger than the predetermined number of times of measurement m (see "No" route in step S77 in FIG. 27), the control determination unit 111 inquires of the measurement value DB 102a about the measurement value (step S78 in FIG. 27).

The control determination unit 111 obtains the latest m determination results D4(b), in the measurement value DB 102a (step S79 in FIG. 27).

The control determination unit 111 integrates the determination results D4(b), and comprehensively determines whether it is necessary to replace the dust-proof bezel 16 (described above with reference to FIG. 2) (step S80 in FIG. 27). Details of the bezel replacement necessity determination will be described below with reference to FIG. 30.

When it is determined that it is unnecessary to replace the dust-proof bezel 16 (see "No" route in step S80 in FIG. 27), the processing returns to step S63 in FIG. 24, and measurement of a CPU temperature and an air volume is repeated.

Meanwhile, when it is determined that it is necessary to replace the dust-proof bezel 16 (see "Yes" route in step S80 in FIG. 27), the control determination unit 111 notifies the management server 2a of deposition of dirt (in step S81 in FIG. 27). The dirt deposition notification is performed for the monitoring unit 212 of the operation management SW 21 via the notification unit 114 and the I/F processor 115 of the BMC 11 and the I/F processor 213 of the operation management SW 21.

The monitoring unit 212 of the operation management SW 21 receives the dirt deposition notification (step S82 in FIG. 27), and notifies the CE 4 of the reception of the dirt deposition notification.

As illustrated in FIG. 28, the CE 4 performs a power-OFF operation of the system, in the casing 1000 of the monitoring target server 1 (step S83 in FIG. 28).

The CE 4 replaces the dust-proof bezel 16, in the casing 1000 of the monitoring target server 1 (step S84 in FIG. 28).

The CE 4 performs a maintenance operation of the monitoring target server 1 besides the replacement of the dust-proof bezel 16 (step S85 in FIG. 28).

The CE 4 performs a power-ON operation of the system, in the casing 1000 of the monitoring target server 1 (step S86 in FIG. 28).

The control determination unit 111 initializes the calibration parameter DB 103 in the storage unit 113, and sets the actually measured value of the air volume D2(a) corresponding to the CPU temperature D1(a) for which the approximate value of the air volume is calculated, as a parameter value in the calibration value DB 101 (step S87 in FIG. 28). Then, the processing returns to step S54 in FIG. 23.

Figure 29:
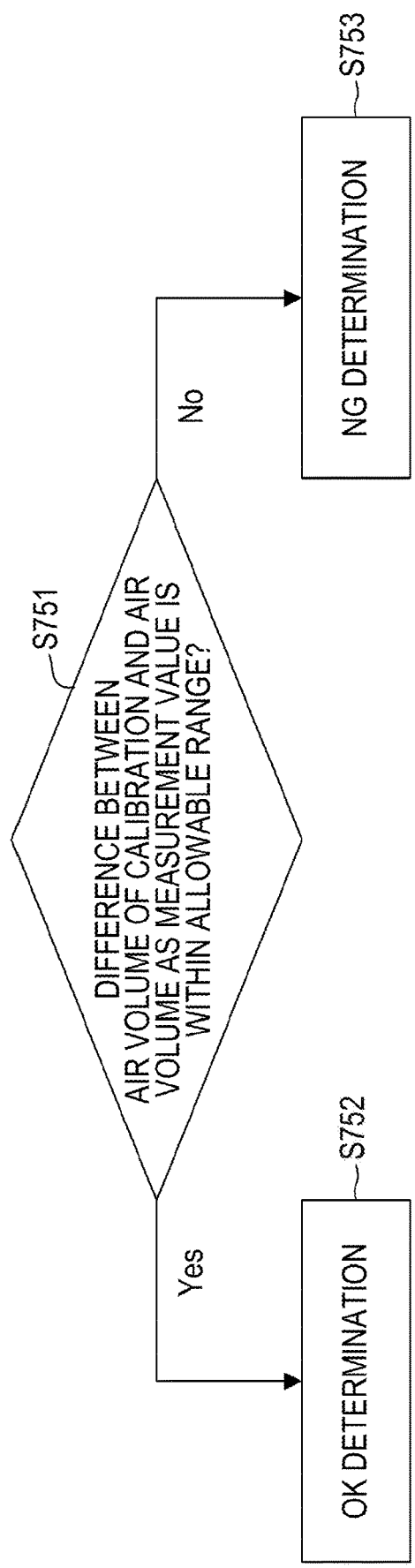
FIG. 29 is a flowchart illustrating details of an air volume comparison processing illustrated in FIG. 27.

Next, details of the air volume comparison processing illustrated in step S75 in FIG. 27 will be described in accordance with a flowchart illustrated in FIG. 29 (steps S751 to S753).

The control determination unit 111 determines whether the difference D2(e) between the air volume of the calibration and the air volume as the measurement value is within the allowable range D6(d) (step S751).

When it is determined that the difference D2(e) is within the allowable range D6(d) (see "Yes" route in step S751), the control determination unit 111 registers "OK" determination in the determination result of the measurement value DB 102a, in the storage unit 113 (step S752). Then, the air volume comparison processing is ended.

For example, an examination is made on a case where the measured air volume D2(b) is 0.14 m³/min, while the air volume D2(a) as the calibration value is 0.15 m³/min and the difference allowable range D6(d) is 10%. In this case, since the difference D2(e) (=(0.15-0.14)/0.15=6.7%) between the actually measured value and the calibration value is equal to or less than the difference allowable range D6(d), that is, 10%, it is determined that dirt is not deposited on the dust-proof bezel 16.

Meanwhile, when it is determined that the difference D2(e) is not within the allowable range D6(d) (see "No" route in step S751), the control determination unit 111 registers "NG" determination in the determination result of the measurement value DB 102a, in the storage unit 113 (step S753). Then, the air volume comparison processing is ended.

For example, an examination is made on a case where the measured air volume D2(b) is 0.14 m³/min, while the air volume D2(a) as the calibration value is 0.15 m³/min and the difference allowable range D6(d) is 5%. In this case, since the difference D2(e) (=(0.15-0.14)/0.15=6.7%) between the actually measured value and the calibration value exceeds the difference allowable range D6(d), that is, 5%, it is determined that dirt is deposited on the dust-proof bezel 16.

Figure 30:
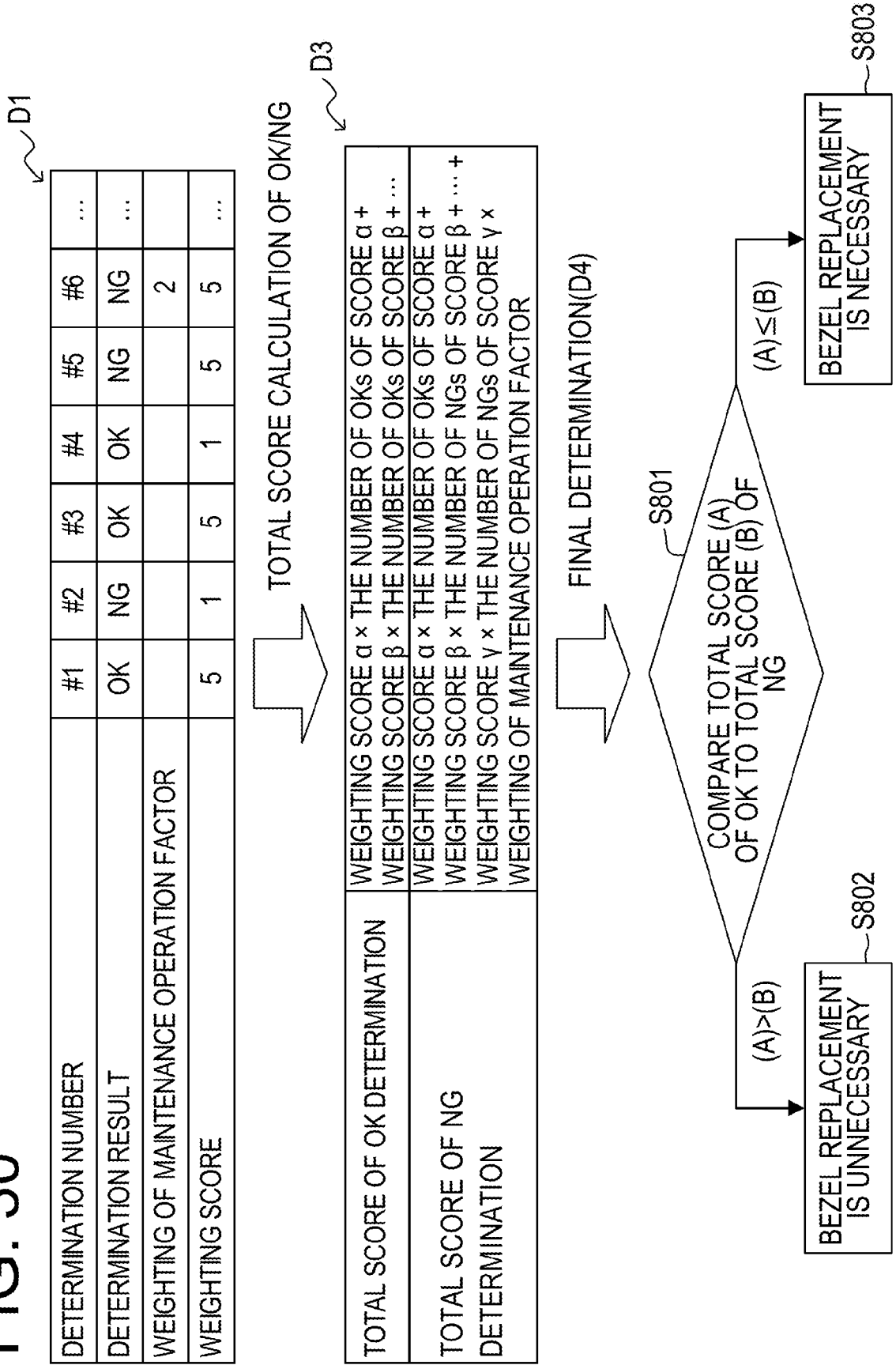
FIG. 30 is a flowchart illustrating details of a bezel replacement necessity determination illustrated in FIG. 27.

Next, details of the bezel replacement necessity determination illustrated in step S80 in FIG. 27 will be described in accordance with tables and a flow chart illustrated in FIG. 30 (reference numerals D1 to D4 and S801 to S803).

In the table indicated by the reference numeral D1, a determination number, a determination result, the weighting of a maintenance operation factor, and a weighting score are associated with each other. For example, for the determination number "#1," the determination result is "OK" and the weighting score is "5," for the determination number "#2," the determination result is "NG" and the weighting score is "1," and for the determination number "#6," the determination result is "NG" and the weighting of the maintenance operation factor is "2." The weighting score "5" may be the weighting of an actual measurement value, and the weighting score "1" may be the weighting of an approximate value.

As indicated by the reference numeral D2, the control determination unit 111 calculates total scores of OK determination and NG determination on the basis of the association among the determination result, the weighting of the maintenance operation factor, and the weighting score.

As indicated by the reference numeral D3, the total scores of the OK determination and the NG determination may be obtained by, for example, the following equations.

$$\text{Total score of OK determination} = \text{weighting score } \alpha \times \text{the number of OKs of score } \alpha + \text{weighting score } \beta \times \text{the number of OKs of score } \beta + \ldots$$

$$\text{Total score of NG determination} = \text{weighting score } \alpha \times \text{the number of NGs of score } \alpha + \text{weighting score } \beta \times \text{the number of NGs of score } \beta + \ldots + \text{weighting score } \gamma \times \text{the number of NGs of score } \gamma \times \text{maintenance operation factor weighting}$$

For example, the weighting scores $\alpha$ and $\gamma$ may be the weightings of actual measurement value, and the weighting score $\beta$ may be the weighting of an approximate value.

When the table indicated by the reference numeral D1 is applied to the numerical formula indicated by the reference numeral D3, the total scores of the OK determination and the NG determination are calculated as in the following equations.

$$\text{Total score of OK determination} = 5 \times 2 + 1 \times 1 = 11$$

$$\text{Total score of NG determination} = 5 \times 1 + 1 \times 1 + 2 \times 5 \times 1 = 16$$

Then, as indicated by the reference numeral D4, the control determination unit 111 performs a final determination on the basis of the calculated total scores of the OK determination and the NG determination.

That is, the control determination unit 111 compares a total score (A) of the OK determination to a total score (B) of the NG determination (step S801).

When the total score (A) of the OK determination is larger than the total score (B) of the NG determination (see "(A)>(B)" route in step S801), the control determination unit 111 determines that it is unnecessary to replace the dust-proof bezel 16 (step S802). Then, the bezel replacement necessity determination is ended.

Meanwhile, when the total score (A) of the OK determination is equal to or less than the total score (B) of the NG determination (see "(A)≤(B)" route in step S801), the control determination unit 111 determines that it is necessary to replace the dust-proof bezel 16 (step S803). Then, the bezel replacement necessity determination is ended.

When half or more of determination results in a predetermined number of measurements (e.g., 12 times a day) continue with the same determinations, the bezel replacement necessity may be determined on the basis of the continuous determination results.

[B-3] Effect

According to the monitoring target server 1 in an example of the second embodiment as described above, for example, the following operation effects may be achieved.

The storage unit 113 stores the weighting of a maintenance operation factor (i.e., a third weighting value) for a case where a maintenance operation is performed on the monitoring target server 1, in a storage area. The control determination unit 111 determines that the dust-proof bezel 16 is abnormal when a value obtained by multiplying the number of times of matching by comparisons by a first or second weighting value is equal to or less than a value obtained by multiplying the number of times of non-matching by comparisons by a first or second weighting value and a third weighting value. The first weighting value may be the weighting of an actual measurement value, and the second weighting value may be the weighting of an approximate value.

Accordingly, when the replacement of the dust-proof bezel 16 is predicted in a short period of time due to occurrence of slight clogging, etc. in the dust-proof bezel 16, the replacement of the dust-proof bezel 16 may be performed concurrently with the maintenance operation at the timing of the maintenance operation of the monitoring target server 1. Thus, it is possible to improve the work efficiency.

The control determination unit 111 determines that the dust-proof bezel 16 is abnormal when in the comparison recently performed a predetermined number of times, the number of times of matching by the comparisons is equal to or less than the number of times of non-matching by the comparisons.

Accordingly, it is possible to determine the replacement necessity of the dust-proof bezel 16 at every timing when measurement and comparison of air volumes are performed. Thus, it is possible to detect the abnormality of the dust-proof bezel 16 early.

The storage unit 113 updates the calibration value DB 101 stored in the storage area when a change in the surrounding environment of the monitoring target server 1 is detected.

Accordingly, it is possible to automatically perform a re-calibration when the surrounding environment of the monitoring target server 1 is changed. Thus, it is possible to prevent an erroneous determination in the replacement necessity determination of the dust-proof bezel 16.

The control determination unit 111 detects a change in the surrounding environment when a change ratio of a difference between the air volume stored in the calibration value DB 101 and the air volume measured by the measurement unit 112 exceeds an allowable range.

Accordingly, even when the management server 2*a* is not capable of detecting a change in the surrounding environment of the monitoring target server 1, the monitoring target server 1 is capable of autonomously detecting a change in the surrounding environment.

[C] Others

The disclosed technology is not limited to the above-described embodiments, and may be implemented through various modifications without departing from the scope of the gist of the embodiments. Configurations and processings in the embodiments may be selected as needed, or may be properly combined.

In examples of the above-described embodiments, although a clogging in the dust-proof bezel 16 provided in the monitoring target server 1 is detected, the present disclosure is not limited thereto. The clogging detection processing of the dust-proof bezel 16 as described above may be applied to various devices to which the dust-proof bezel 16 is provided.

In examples of the above-described embodiments, although the clogging detection processing of the dust-proof bezel 16 is performed in the BMC 11, the present disclosure is not limited thereto. For example, each processing other than the temperature measurement of the CPU 12 may be implemented by functions in the CPU 12.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus comprising:
   a first processor;
   a fan that cools the first processor;
   a casing;
   a first dust-proof bezel that prevents dust from entering the casing;
   a memory that stores a plurality of registered temperature values of the first processor and a plurality of registered air volume values of an air flow generated by the fan, wherein the registered temperature values and the registered air volume values are respectively associated with each other; and
   a second processor coupled to the memory, the second processor configured to:
      measure a temperature value of the first processor and an air volume value of an air flow generated by the fan which passes through the first dust-proof bezel;
      compare the measured temperature value with each of the plurality of registered temperature values stored in the memory;
      determine that the measured temperature value does not match any of the plurality of registered temperature values;
      linearly approximate each of the plurality of registered air volume values stored in the memory;
      calculate an approximate air volume value based on the linear approximations of each of the plurality of registered air volume values stored in the memory, wherein the calculated approximate air volume value corresponds to the measured temperature value;
      determine that the measured air volume value is less than the calculated approximate air volume value; and
      determine that an abnormality exists in the first dust-proof bezel based on the determination that the measured air volume is less than the calculated approximate air volume value, wherein the first dust-proof bezel is replaced with a new dust-proof bezel when the abnormality of the first dust-proof bezel is determined to exist.

2. The information processing apparatus according to claim 1, wherein the second processor is further configured to:
   register, in the memory, the calculated approximate air volume value in association with the measured temperature value.

3. The information processing apparatus according to claim 1, wherein the second processor is further configured to:
   update the plurality of registered temperature values and the plurality of registered air volume values when a change in the surrounding environment of the information processing apparatus is detected.

4. The information processing apparatus according to claim 3, wherein the second processor is further configured to:
   detect the change in the surrounding environment when a change ratio of a difference between any of the registered air volume values and the measured air volume value exceeds a. predetermined range.

5. The information processing apparatus according to claim 4, wherein the second processor is further configured to:
   store the change ratio in the memory.

6. The information processing apparatus according to claim 1, wherein the second processor is further configured to:
transmit a notification indicating that the abnormality exists in the first dust-proof bezel to a management server located remotely from the information processing apparatus.

7. The information processing apparatus according to claim 1. wherein the second processor is further configured to:
control operation of the fan based on the measured temperature value and the measured air volume value.

8. A non-transitory computer-readable recording medium having stored therein a program that when executed by a computer causes the computer to execute a process, the process comprising:
storing, in a memory of the computer, a plurality of registered temperature values of a processor of the computer and a plurality of registered air volume values of an air flow generated by a fan of the computer that cools the processor, wherein the registered temperature values and the registered air volume values are respectively associated with each other;
measuring a temperature value of the processor and an air volume value of an air flow generated by the fan which passes through a first dust-proof bezel of the computer, wherein the first dust-proof bezel prevents dust from entering a casing of the computer;
comparing the measured temperature value with each of the plurality of registered temperature values stored in the memory;
determining that the measured temperature value does not match any of the plurality of registered temperature values;
linearly approximating each of the plurality of registered air volume values stored in the memory
calculating an approximate air volume value based on the linear approximations of each of the plurality of registered air volume values stored in the memory, wherein the calculated approximate air volume value corresponds to the measured temperature value:
determining that the measured air volume value is less than the calculated approximate air volume value;
determining that an abnormality exists in the first dust-proof bezel based on the determination that the measured air volume is less than the calculated approximate air volume value; and
replacing the first dust-proof bezel with a new dust-proof bezel when the abnormality of the first dust-proof bezel is determined to exist.

9. The non-transitory computer-readable recording medium according to claim 8, the process further comprising:
registering, in the memory, the calculated approximate air volume value in association with the measured temperature value.

10. The non-transitory computer-readable recording medium according to claim 8, the process further comprising:
updating the plurality of registered temperature values and the plurality of registered air volume values when a change in the surrounding environment of the computer is detected.

11. The non-transitory computer-readable recording medium according to claim 10, the process further comprising:
detecting, the change in the surrounding environment when a change ratio of a difference between any of the registered air volume values and the measured air volume value exceeds a predetermined range.

12. The non-transitory computer-readable recording medium according to claim 11, the process further comprising:
storing the change ratio in the memory.

13. The non-transitory computer-readable recording medium according to claim 8, the process further comprising:
transmitting a notification indicating that the abnormality exists in the first dust-proof bezel to a management server located remotely from the computer.

14. The non-transitory computer-readable recording medium according to claim 8, the process further comprising:
controlling operation of the fan based on the measured temperature value and the measured air volume value.

15. An information processing method comprising:
storing, by a computer and in a memory of the computer, a plurality of registered temperature values of a processor of the computer and a plurality of registered air volume values of an air flow generated by a fan of the computer that cools the processor, wherein the registered temperature values and the registered air volume values are respectively associated with each other;
measuring a temperature value of the processor and an air volume value of an air flow generated by the fan which passes through a first dust-proof bezel of the computer, wherein the first dust-proof bezel prevents dust from entering a casing of the computer;
comparing the measured temperature value with each of the plurality of registered temperature values stored in the memory;
determining that the measured temperature value does not match any of the plurality of registered temperature values;
linearly approximating each of the plurality of registered air volume values stored in the memory;
calculating an approximate air volume value based on the linear approximations of each of the plurality of registered air volume values stored in the memory, wherein the calculated approximate air volume value corresponds to the measured temperature value;
determining that the measured air volume value is less than the calculated approximate air volume value;
determining that an abnormality exists in the first dust-proof bezel based on the determination that the measured air volume is less than the calculated approximate air volume value; and
replacing the first dust-proof bezel with a new dust-proof bezel when the abnormality of the first dust-proof bezel is determined to exist.

16. The information processing method according to claim 15, further comprising:
registering, in the memory, the calculated approximate air volume value in association with the measured temperature value.

17. The information processing method according to claim 15, further comprising:
updating the plurality of registered temperature values and the plurality of registered air volume values when a change in the surrounding environment of the computer is detected.

18. The information processing method according to claim 17, further comprising:

detecting, the change in the surrounding environment when a change ratio of a difference between any of the registered air volume values and the measured air volume value exceeds a predetermined range; and storing the change ratio in the memory.

19. The information processing method according to claim 15, further comprising:

transmitting a notification indicating that the abnormality exists in the first dust-proof bezel to a management server located remotely from the computer.

20. The information processing method according to claim 15, further comprising:

controlling operation of the fan based on the measured temperature value and the measured air volume value.

\* \* \* \* \*